(12) United States Patent
Chiu et al.

(10) Patent No.: US 10,879,201 B2
(45) Date of Patent: Dec. 29, 2020

(54) SEMICONDUCTOR PACKAGE FOR WAFER LEVEL PACKAGING AND MANUFACTURING METHOD THEREOF

(71) Applicant: Taiwan Semiconductor Manufacturing Co., Ltd., Hsinchu (TW)

(72) Inventors: Ming-Yen Chiu, Hsinchu County (TW); Shou-Yi Wang, Hsinchu (TW); Tsung-Shu Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/997,941

(22) Filed: Aug. 20, 2020

(65) Prior Publication Data

US 2020/0381382 A1 Dec. 3, 2020

Related U.S. Application Data

(63) Continuation of application No. 16/281,092, filed on Feb. 21, 2019, now Pat. No. 10,756,038.

(51) Int. Cl.
*H01L 23/522* (2006.01)
*H01L 23/00* (2006.01)
(Continued)

(52) U.S. Cl.
CPC ............ *H01L 24/09* (2013.01); *H01L 21/565* (2013.01); *H01L 23/3185* (2013.01);
(Continued)

(58) Field of Classification Search
CPC .............. H01L 21/565; H01L 23/3185; H01L 23/5226; H01L 24/03; H01L 24/09;
(Continued)

(56) References Cited

U.S. PATENT DOCUMENTS 9,000,584 B2 4/2015 Lin et al.
9,048,222 B2 6/2015 Hung et al.
(Continued)

*Primary Examiner* — Andrew Q Tran
(74) *Attorney, Agent, or Firm* — JCIPRNET

(57) ABSTRACT

A semiconductor package includes a semiconductor die and a connection structure. The semiconductor die is laterally encapsulated by an insulating encapsulant. The connection structure is disposed on the semiconductor die, the connection structure is electrically connected to the semiconductor die, and the connection structure includes at least one first via, first pad structures, second vias, a second pad structure and a conductive terminal. The at least one first via is disposed over and electrically connected to the semiconductor die. The first pad structures are disposed over the at least one first via, wherein the at least one first via contacts at least one of the first pad structures. The second vias are disposed over the first pad structures, wherein the second vias contact the first pad structures. The second pad structure is disposed over and contacts the second vias, wherein a vertical projection of each of first pad structures overlaps with a vertical projection of the second pad structure, and an overall area of the vertical projections of the first pad structures is smaller than an area of the vertical projection of the second pad structure. The conductive terminal is disposed over and connects with the second pad structure.

20 Claims, 24 Drawing Sheets

(51) Int. Cl.
*H01L 23/31* (2006.01)
*H01L 21/56* (2006.01)

(52) U.S. Cl.
CPC .......... *H01L 23/5226* (2013.01); *H01L 24/03* (2013.01); *H01L 24/11* (2013.01); *H01L 24/14* (2013.01); *H01L 2224/02331* (2013.01)

(58) Field of Classification Search
CPC ......... H01L 24/11; H01L 24/14; H01L 24/20; H01L 2224/02331
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,756,038 B1 * | 8/2020 | Chiu .................. H01L 23/3185 |

* cited by examiner

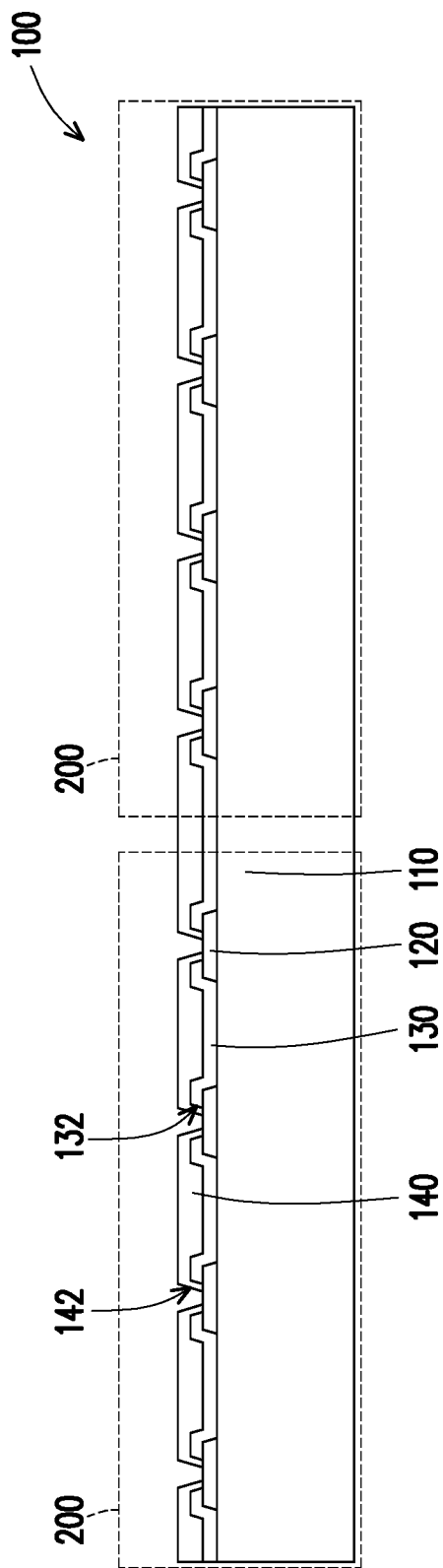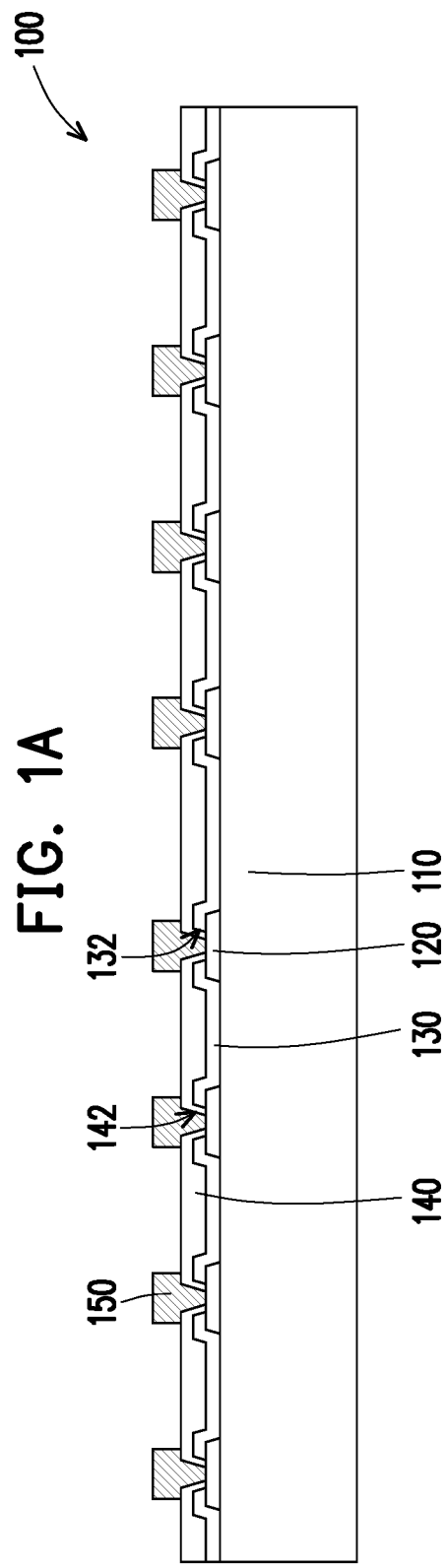

SEMICONDUCTOR PACKAGE FOR WAFER LEVEL PACKAGING AND MANUFACTURING METHOD THEREOF

CROSS-REFERENCE TO RELATED APPLICATION

This application is a continuation application of and claims the priority benefit of a prior application Ser. No. 16/281,092, filed on Feb. 21, 2019. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. How to ensure the reliability of the wafer level packaging has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
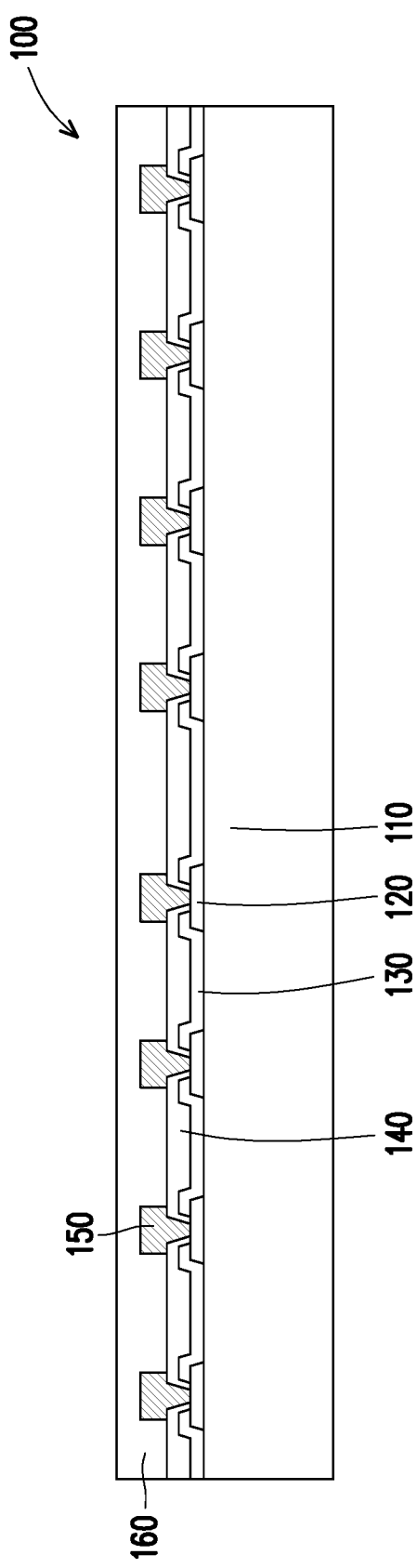
FIG. 1A to FIG. 1P are schematic cross-sectional views illustrating process steps of manufacturing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1D:
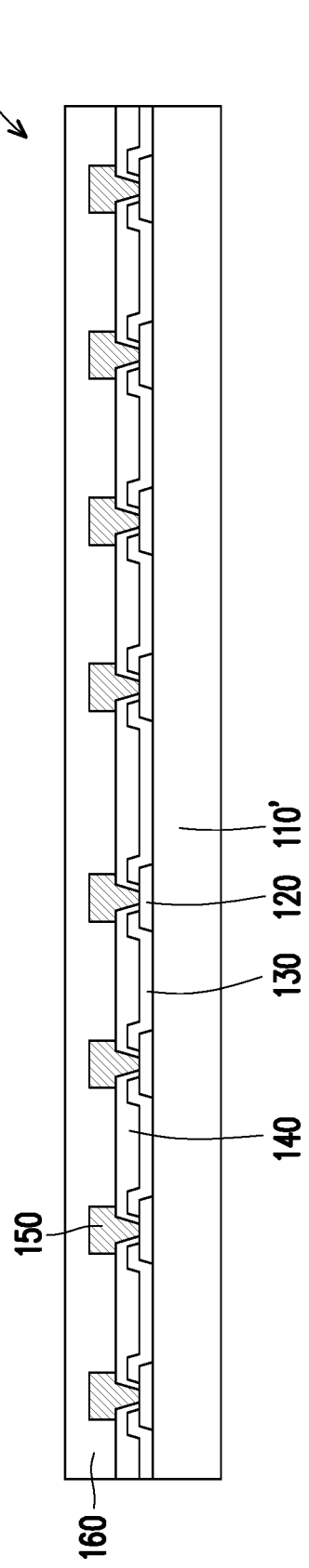
Figure 1E:
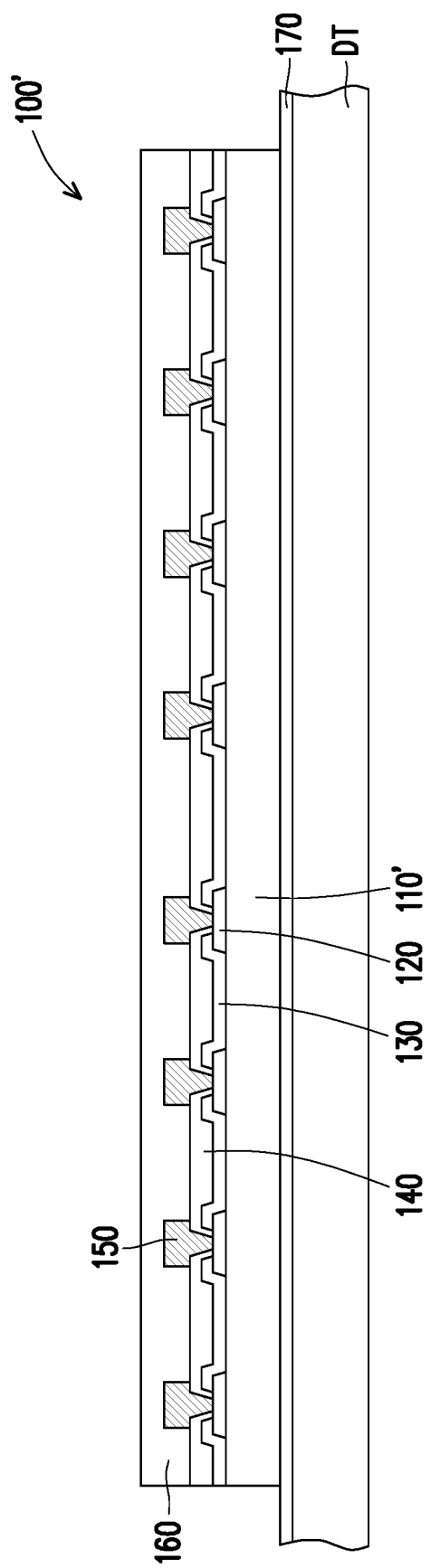
Figure 1F:
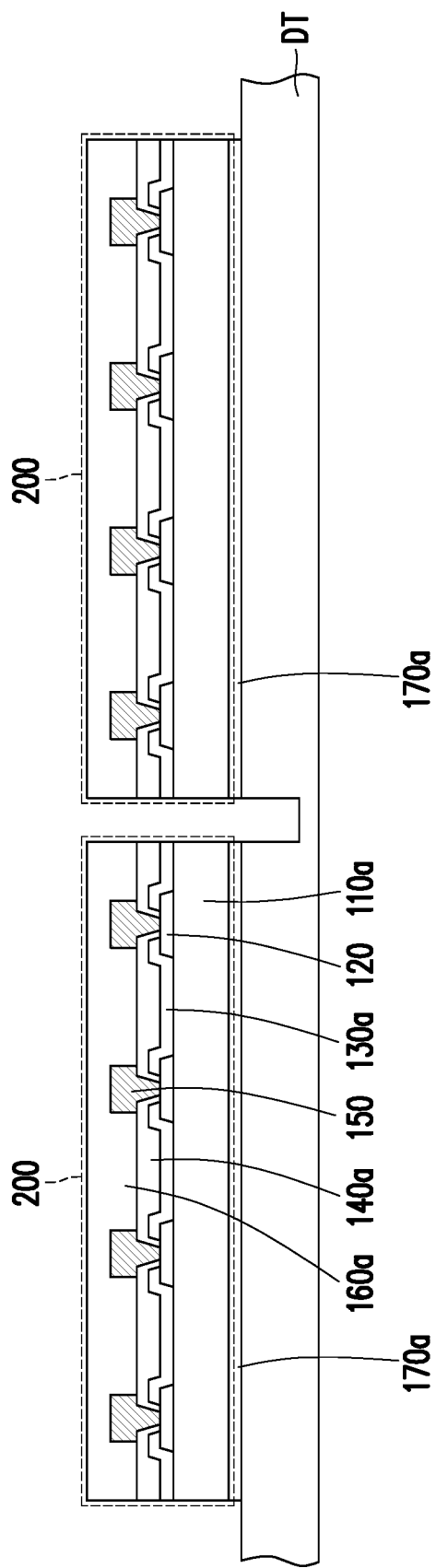
Figure 1G:
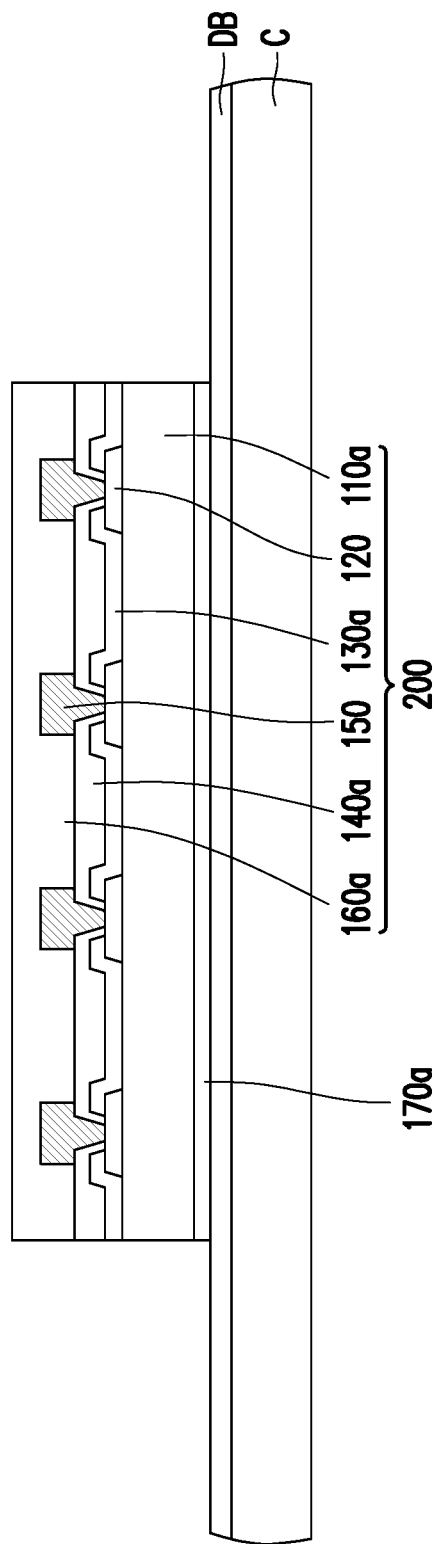
Figure 1H:
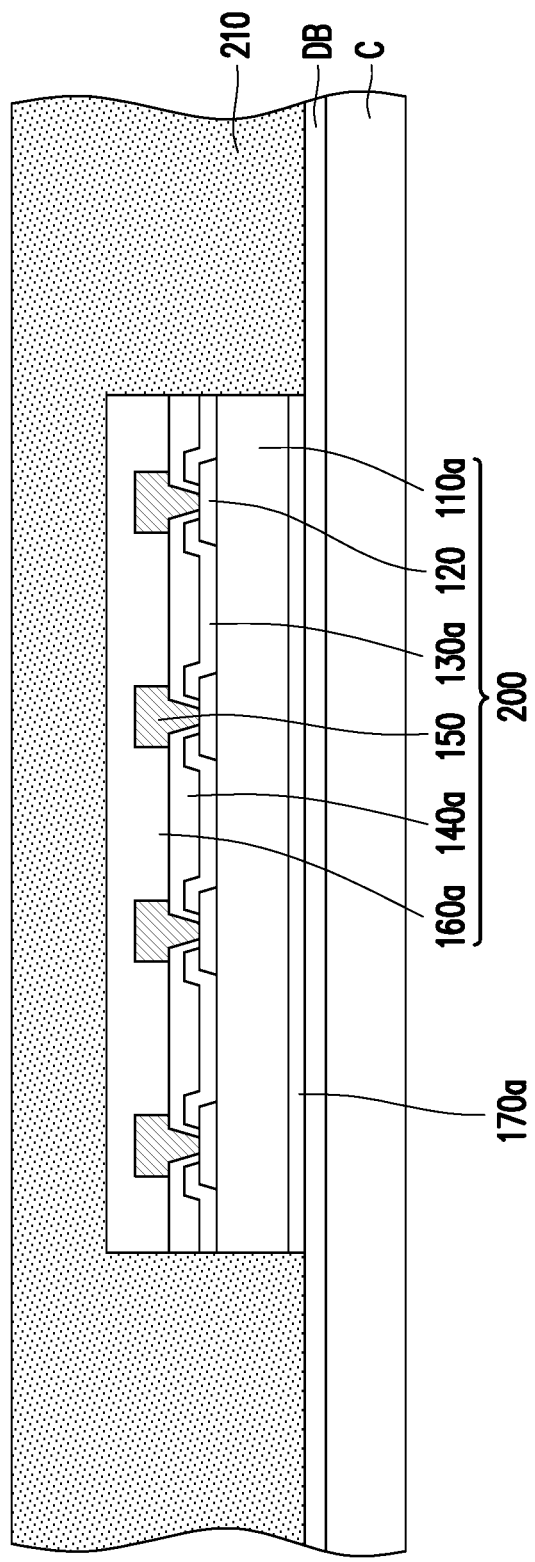
Figure 1I:
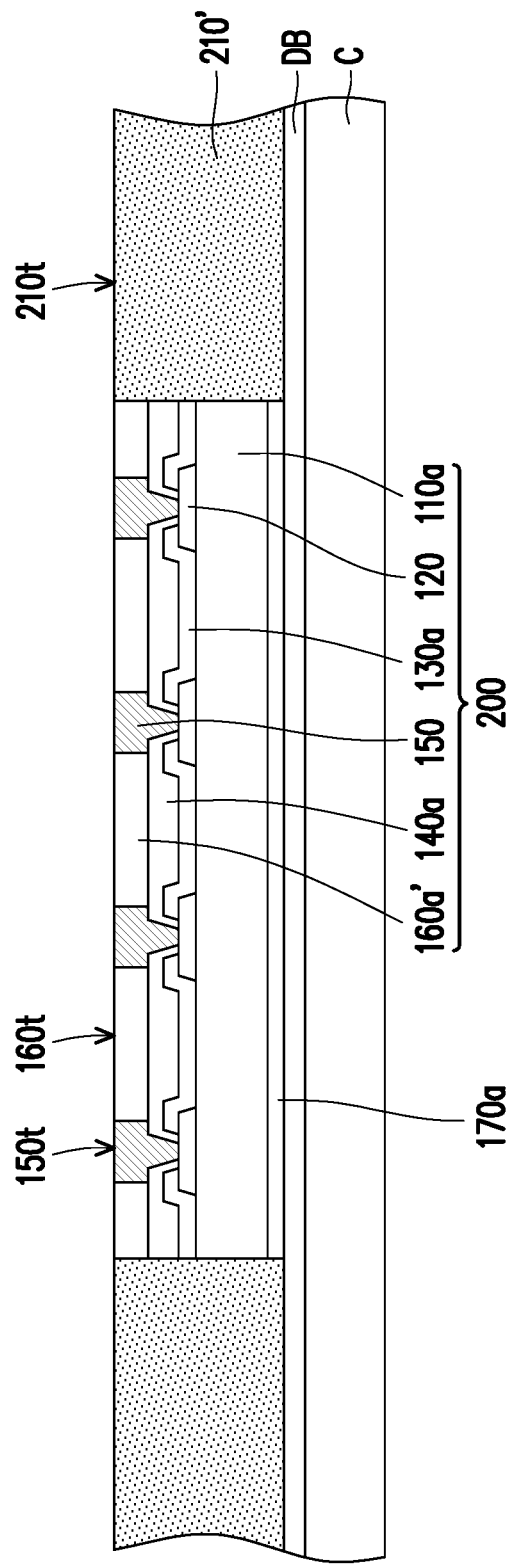
Figure 1J:
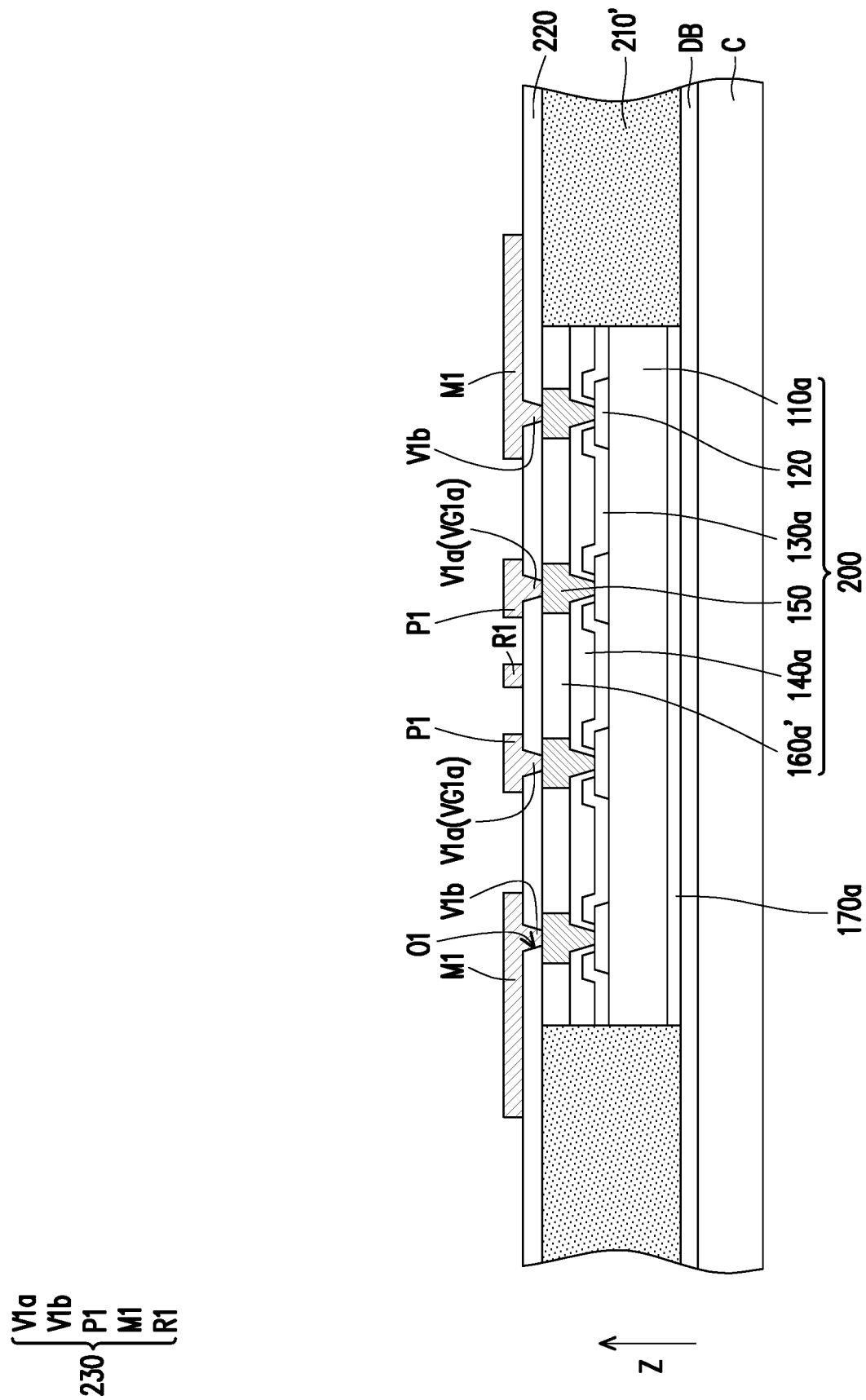
Figure 1K:
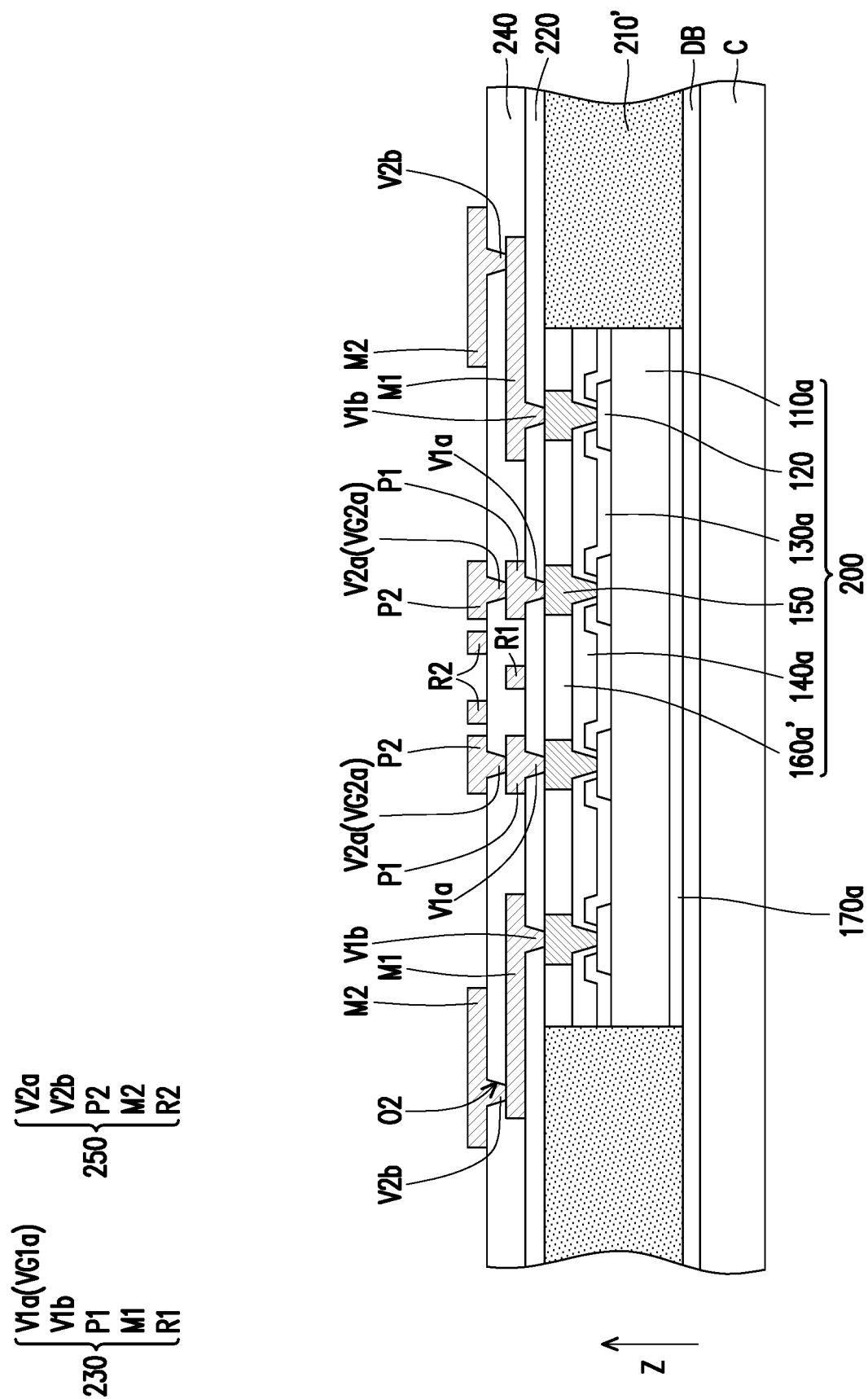
Figure 1L:
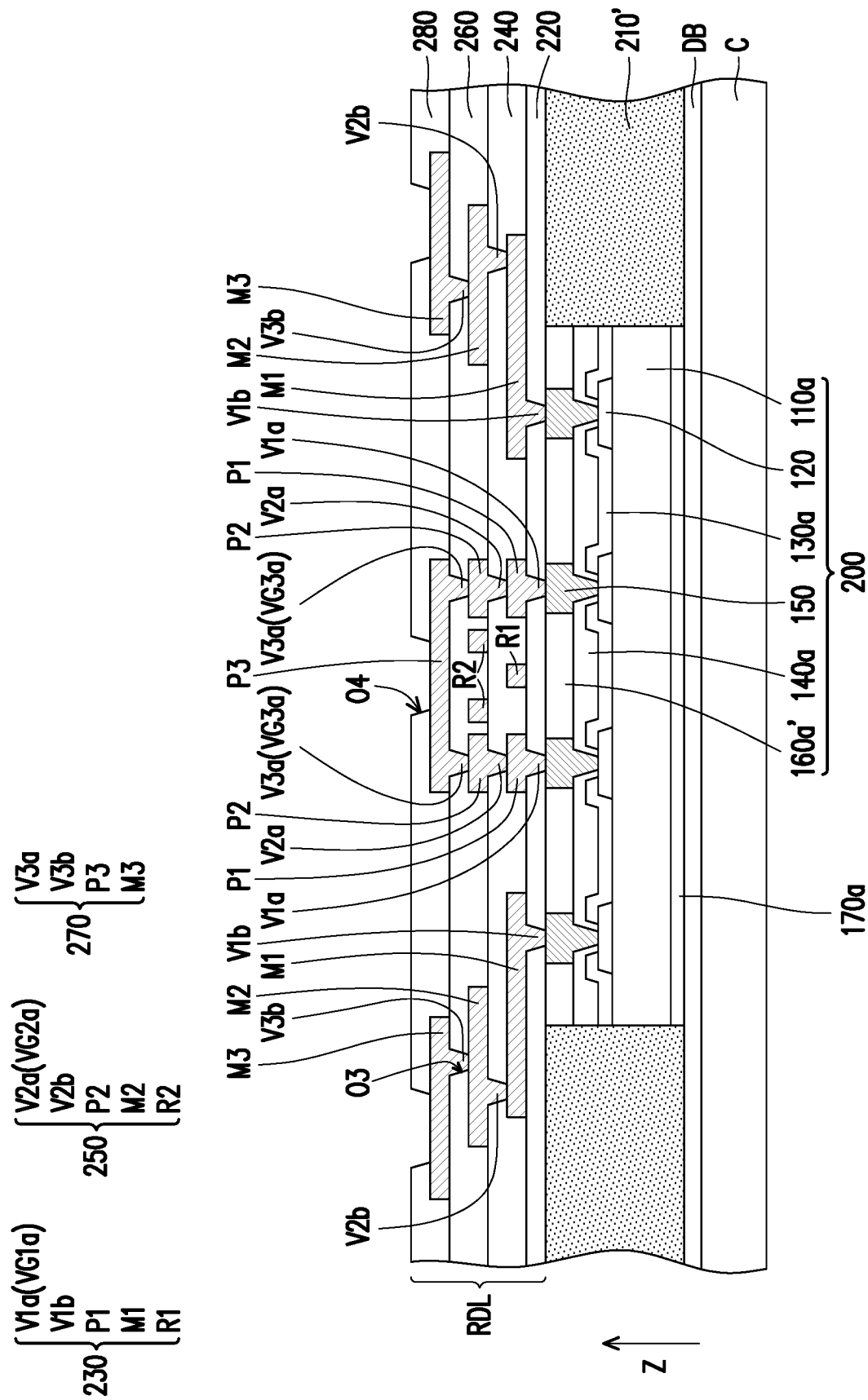
Figure 1M:
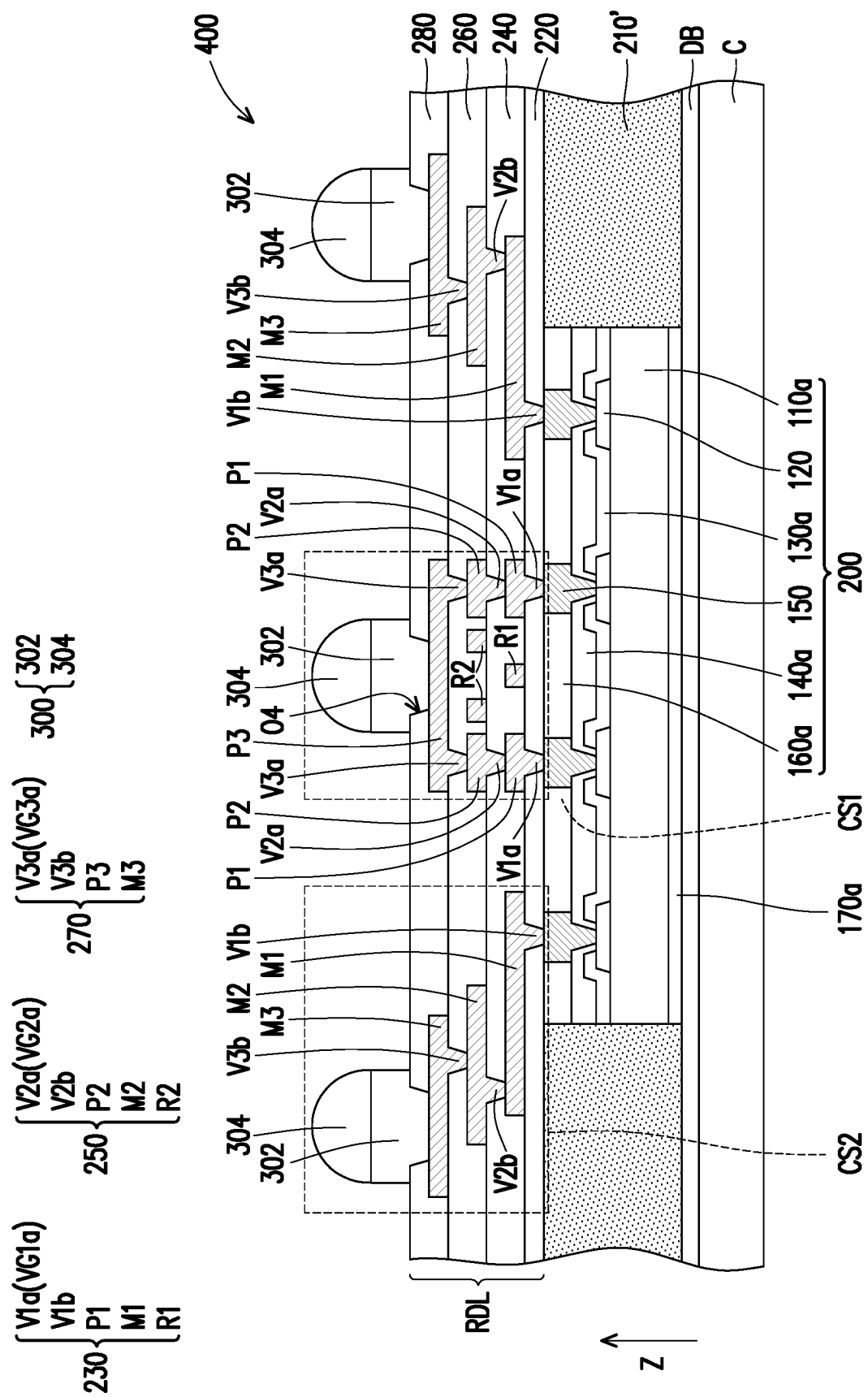
Figure 1N:
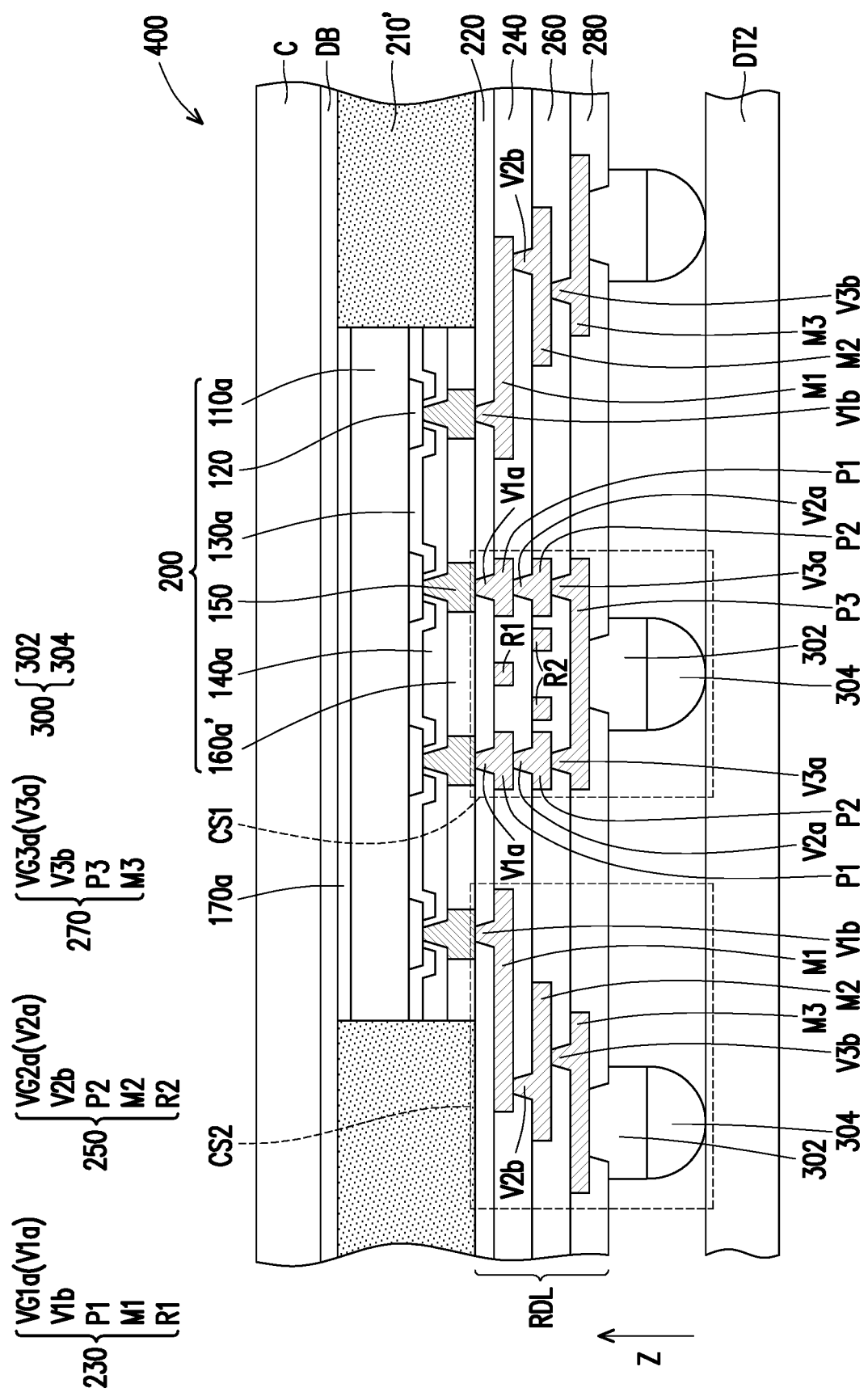
Figure 10:
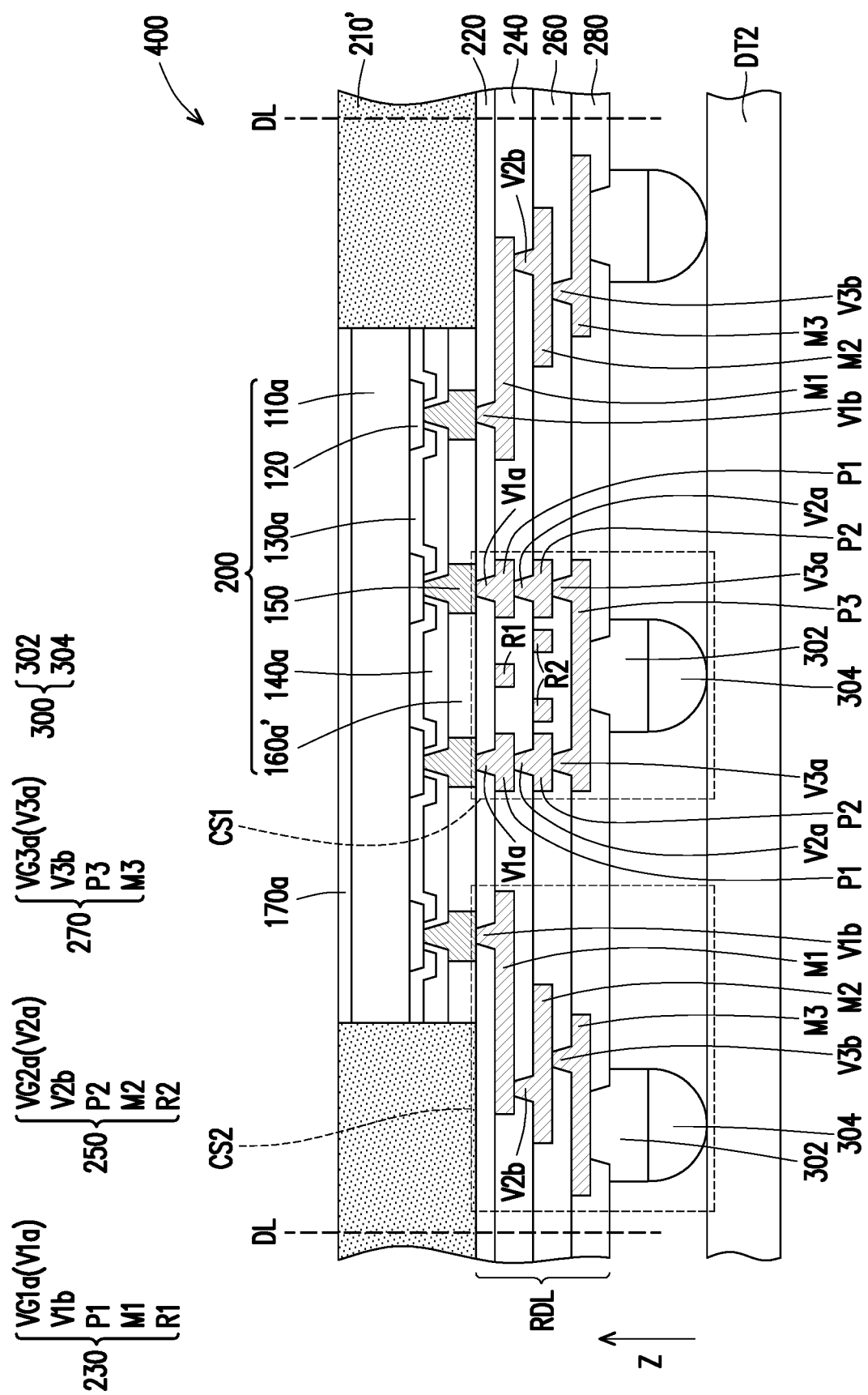
Figure 1P:
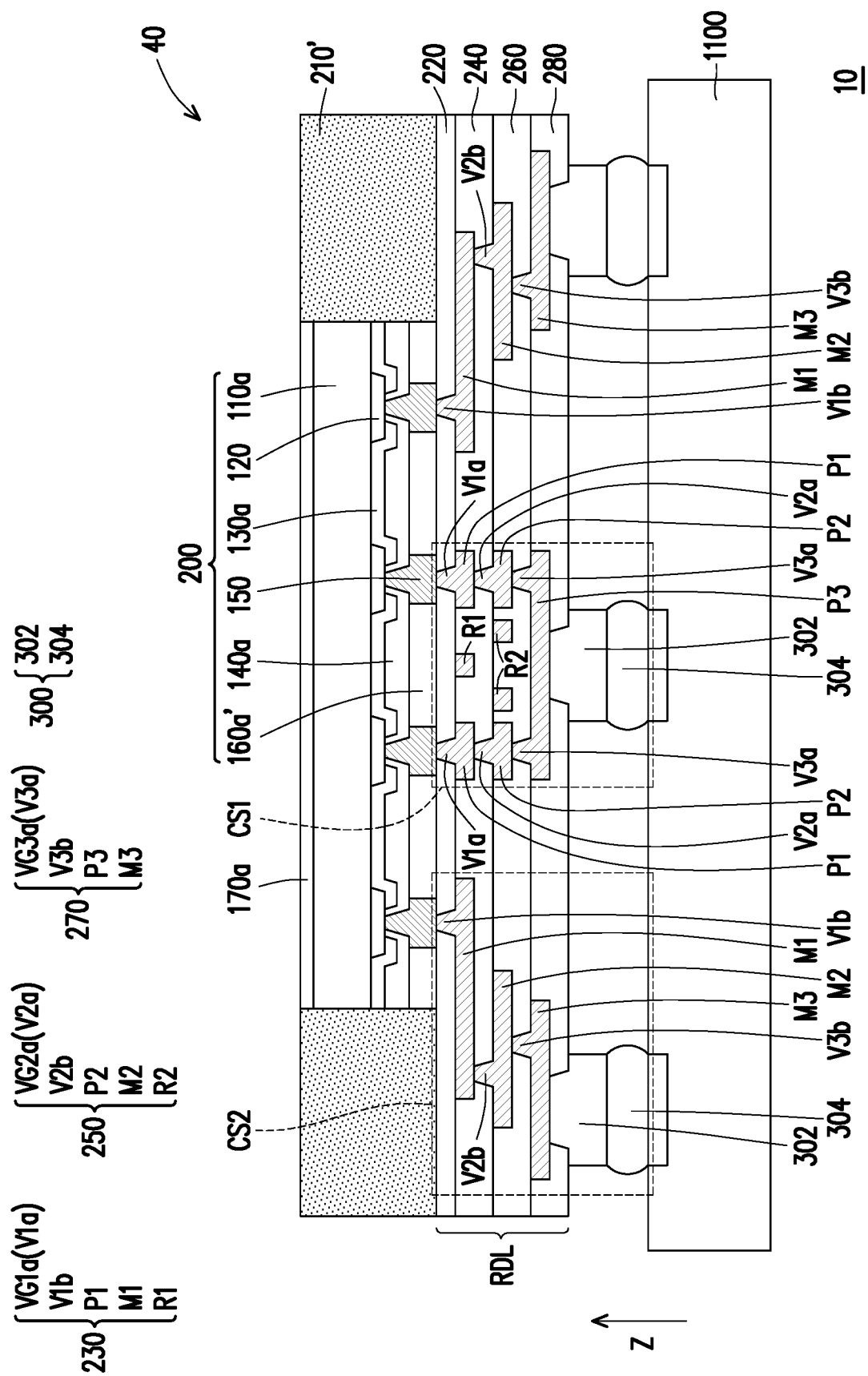

FIG. 1A to FIG. 1P are schematic cross-sectional views illustrating process steps of manufacturing a semiconductor package in accordance with some embodiments.

Referring to FIG. 1A, a wafer 100 including a plurality of semiconductor dies or integrated circuit components 200 arranged in an array is provided. Before a wafer dicing process is performed on the wafer 100, the semiconductor dies 200 of the wafer 100 are connected one another. In some embodiments, the wafer 100 may include a semiconductor substrate 110, a plurality of conductive pads 120 formed on the semiconductor substrate 110, and a passivation layer 130. The passivation layer 130 is formed over the semiconductor substrate 110 and has a plurality of contact openings 132 such that the conductive pads 120 are partially revealed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1A, in some embodiments, the wafer 100 may further include a post-passivation layer 140 formed on the passivation layer 130. The post-passivation layer 140 covers the passivation layer 130 and has a plurality of contact openings 142. The conductive pads 120 revealed by the contact openings 132 of the passivation 130 are partially revealed by the contact openings 142 of the post passivation layer 140. For example, the post-passivation layer 140 may be a polyimide (PI) layer, a polybenzoxazole (PBO) layer, or a dielectric layer formed by other suitable polymers. The passivation layer 130 and the post passivation layer 140 may be regarded as a composite passivation layer. Alternatively, the composite passivation layer may be replaced by a single passivation layer.

Referring to FIG. 1B, a plurality of conductive pillars 150 are formed on the conductive pads 120. In some embodiments, the conductive pillars 150 are plated on the conductive pads 120. The plating process of conductive pillars 150 is described in detail as followings. First, a seed layer may be sputtered onto the post-passivation layer 140 and the conductive pads 120 revealed by the contact openings 142. A patterned photoresist layer (not shown) may be then formed over the seed layer by photolithography, wherein the patterned photoresist layer reveals portions of the seed layer that are corresponding to the conductive pads 120. The wafer 100 including the patterned photoresist layer formed thereon may be immersed into a plating solution in a plating bath such that the conductive pillars 150 are plated on the portions of the seed layer that are corresponding to the conductive pads 120. After forming the plated conductive pillars 150, the patterned photoresist layer is stripped. Thereafter, by using the conductive pillars 150 as a hard mask, portions of the seed layer that are not covered by the conductive pillars 150 may be removed through etching until the post passivation layer 140 is revealed, for example. In some embodiments, the plated conductive pillars 150 may be plated copper pillars.

Referring to FIG. 1C, after the conductive pillars 150 are formed, a protection layer 160 is formed on the post passivation layer 140 so as to cover the conductive pillars 150. In some embodiments, the protection layer 160 may be a polymer layer having sufficient thickness to encapsulate and protect the conductive pillars 150. For example, the protection layer 160 may be a polybenzoxazole (PBO) layer, a polyimide (PI) layer or other suitable polymers. In some alternative embodiments, the protection layer 160 may be made of inorganic materials.

Referring to FIG. 1C and FIG. 1D, a back-side grinding process is performed on the back surface of the wafer 100 after forming the protection layer 160. During the back-side grinding process, the semiconductor substrate 110 is ground by a grinding wheel such that a thinned wafer 100' including a thinned semiconductor substrate 110', the conductive pads 120 formed on the semiconductor substrate 110', the passivation layer 130, the post passivation layer 140, the conductive pillars 150 and the protection layer 160 is formed.

Referring to FIG. 1E, after performing the back-side grinding process, a dicing tape DT including an adhesive layer 170 is provided and the thinned wafer 100' is mounted on the adhesive layer 170 carried by the dicing tape DT such that the back surface of the thinned semiconductor substrate 110' is adhered with the adhesive layer 170 on the dicing tape DT. In some embodiments, the dicing tape DT may support the thinned wafer 100' mounted thereon and the adhesive layer 170 may temporarily adhere with the back surface of the thinned wafer 100'. In some embodiments, the dicing tape DT may include PVC, polyolefin, polyethylene, or other suitable materials. Furthermore, the adhesive layer 170 may include a liquid-type die attach film (DAF) or a liquid-type film over wire (FOW).

Referring to FIG. 1E and FIG. 1F, after mounting the thinned wafer 100' on the dicing tape DT, a wafer dicing process is performed on the thinned wafer 100' such that the semiconductor dies 200 in the thinned wafer 100' are singulated from one another. In some embodiments, the wafer dicing process may be performed to cut through the thinned wafer 100', the adhesive layer 170 and cut into the dicing tape DT. After the singulation process, a plurality of semiconductor dies 200 and a plurality of adhesive layers 170a are formed. As shown in FIG. 1F, each of the semiconductor dies 200 includes a semiconductor substrate 110a, the conductive pads 120 formed on the semiconductor substrate 110a, a passivation layer 130a, a post passivation layer 140a, the conductive pillars 150, and a protection layer 160a. In some embodiments, the adhesive layers 170a are adhered to the back surfaces of the semiconductor substrates 110a. The materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a in the semiconductor dies 200 are omitted.

During the back-side grinding and the wafer dicing processes, the protection layer 160 may well protect the conductive pillars 150. In addition, the protection layer 160a may well protect the conductive pillars 150 of the semiconductor dies 200 from being damaged by subsequently performed processes, such as the picking-up and placing process of the semiconductor dies 200, the molding process, and so on.

Referring to FIG. 1F and FIG. 1G, a carrier C having a de-bonding layer DB formed thereon is provided. In some embodiments, the carrier C is a glass substrate and the de-bonding layer DB includes a light-to-heat conversion (LTHC) release layer formed on the glass substrate. In some alternative embodiments, a dielectric layer (not shown) may be formed on the de-bonding layer DB such that the de-bonding layer DB is between the carrier C and the dielectric layer. In some embodiments, the dielectric layer includes a buffer layer and the material of the buffer layer includes polyimide (PI), polybenzoxazole (PBO), benzocyclobutene (BCB), or any other suitable polymer-based dielectric material. In some embodiments, the buffer layer may be an Ajinomoto Buildup Film (ABF), a solder resist film, or the like.

As shown in FIG. 1F and FIG. 1G, in some embodiments, at least one semiconductor die 200 is picked-up from the dicing tape DT and placed on the de-bonding layer DB of the carrier C. In some embodiments, the semiconductor die 200 is adhered to the carrier C through the adhesive layer 170a. In alternative embodiments, the semiconductor die 200 is adhered to the de-bonding layer DB without the adhesive layer 170a. In some alternative embodiments, more than one of the semiconductor dies 200 are picked-up from the dicing tape DT and placed on the de-bonding layer DB, wherein the semiconductor dies 200 placed on the de-bonding layer DB may be arranged in an array.

Referring to FIG. 1H, an insulating material 210 is formed on the de-bonding layer DB to cover the semiconductor die 200. In some embodiments, the insulating material 210 is a molding compound formed by a molding process. As shown in FIG. 1H, the protection layer 160a of the semiconductor die 200 is covered by the insulating material 210. In other words, the protection layer 160a of the semiconductor die 200 is not revealed and is well protected by the insulating material 210. In some embodiments, the insulating material 210 includes epoxy resins or other suitable resin materials.

Referring to FIG. 1I, a planarization process is performed to remove the insulating material 210 and the protection layer 160a until top surfaces 150t of the conductive pillars 150 are exposed. In some embodiments, the planarization process is performed by performing a mechanical grinding process and/or a chemical mechanical polishing (CMP) process. After the insulating material 210 is polished or ground, an insulating encapsulation 210' is formed over the de-bonding layer DB to laterally encapsulate the semiconductor die 200. During the planarization process, not only the insulating material 210 is removed, a portion of the protection layer 160a above the top surfaces 150t of the conductive pillars 150 are also removed to form planarized protection layers 160a'.

As shown in FIG. 1I, the insulating encapsulation 210' wraps and surrounds sidewalls of the semiconductor die 200. That is to say, the semiconductor die 200 is laterally encapsulated by the insulating encapsulant 210'. In other words, the semiconductor die 200 is embedded in the insulating encapsulant 210'. It should be noted that, top surfaces 150t of the conductive pillars 150 and a top surface 160t of the protection layer 160a' are substantially coplanar with a top surface 210t of the insulating encapsulant 210'.

Referring to FIG. 1J through FIG. 1L, after the insulating encapsulant 210' is formed, a redistribution circuit structure RDL electrically connected to the conductive pillars 150 of the semiconductor die 200 is formed on the top surface 210t of the insulating encapsulant 210', the top surfaces 150t of the conductive pillars 150, and the top surface 160t of the protection layer 160a'. The redistribution circuit structure RDL is fabricated to electrically connect to one or more connectors underneath. Here, the afore-said connectors may be the conductive pillars 150 of the semiconductor die 200. The redistribution circuit structure RDL is described in detail in the following discussion.

The following descriptions are focused on a manufacturing method of the redistribution circuit structure RDL in accordance with FIG. 1J through FIG. 1L.

Referring to FIG. 1J, a dielectric layer 220 is formed on the insulating encapsulant 210' and the semiconductor die 200. In some embodiments, the dielectric layer 220 may be formed of a polymeric material including polyimide, PBO or BCB. The dielectric layer 220 may be formed by a suitable fabrication technique such as spin-coating, lamination, deposition, or the like. Then, the dielectric layer 220 is patterned to have a plurality of openings O1, such that the conductive pillars 150 of the semiconductor die 200 are partially revealed by the openings O1 of the dielectric layer 220. In some embodiments, the dielectric layer 220 may be patterned by photolithography and etching processes.

As shown in FIG. 1J, after the dielectric layer 220 is formed, a redistribution conductive layer 230 is formed on the dielectric layer 220 and covers the openings O1 of the dielectric layer 220. In some embodiments, a material of the redistribution conductive layer 230 may include aluminum, titanium, copper, nickel, tungsten, and/or alloys thereof. The redistribution conductive layer 230 may be formed by forming a metal-containing layer by, for example, electroplating or deposition, and then patterning through photolithography and etching processes. In some embodiments, the redistribution conductive layer 230 is electrically connected to the semiconductor die 200. In some embodiments, the redistribution conductive layer 230 includes a plurality of via V1a, a plurality of vias V1b, a plurality of pad structures P1, a plurality of conductive patterns M1, and a routing line R1. In some embodiments, the vias V1a and the vias V1b are disposed on the semiconductor die 200 and the vias V1a and the vias V1b physically contact the conductive pillars 150 of the semiconductor die 200. In some embodiments, the pad structures P1 are disposed on and contact the vias V1a in a one-to-one way. However, in some alternative embodiments, the pad structures P1 are disposed on and contact the vias V1a in a one-to-multiple way. In some embodiments, the conductive patterns M1 contact and connect with the vias V1b. In some embodiments, the routing line R1 is disposed over the vias V1a (formed as a via group VG1a) and the vias V1b and is located between the pad structures P1. In some embodiments, the pad structures P1, the conductive patterns M1 and the routing line R1 are located at the same level in the redistribution conductive layer 230. That is, in some embodiments, the pad structures P1, the conductive patterns M1 and the routing line R1 are located at the same virtual plane perpendicular to the thickness direction Z. In some embodiments, the via group VG1a, the vias V1b, the pad structures P1, the conductive patterns M1 and the routing line R1 are formed at the same time in the same process step. For example, the formation of the via group VG1a, the vias V1b, the pad structures P1, the conductive patterns M1 and the routing line R1 includes forming a blanket copper seed layer, forming a mask pattern over the blanket copper seed layer, performing a plating process to form the vias V1a, the vias V1b, the pad structures P1, the conductive patterns M1 and the routing line R1, removing the mask pattern, and removing portions of the blanket copper seed layer not covered by the vias V1a, the vias V1b, the pad structures P1, the conductive patterns M1 and the routing line R1. However, in some alternative embodiments, the vias V1a and the vias V1b are formed at the same time in one process step, but the pad structures P1, the conductive patterns M1 and the routing line R1 may be formed in another process step(s).

In some embodiments, the vias V1a and the vias V1b are formed to fill up the openings O1 of the dielectric layer 220 such that the vias V1a and the vias V1b physically contact the conductive pillars 150 of the semiconductor die 200 partially revealed by the openings O1 of the dielectric layer 220. In some embodiments, each of the conductive patterns M1 may include a narrow extension portion and a wide pad portion, wherein the wide pad portion may function as a pad and connect with the underlying via V1b, and the narrow extension portion may function as a routing line or a trace. In some embodiments, the routing line R1 may be a portion of the corresponding one of the conductive patterns M1. However, in some alternative embodiments, the routing line R1 may function independently for fan-out routing and is not part of the conductive patterns M1. In some embodiments, the pad structures P1 are disposed above the semiconductor die 200 and are located within the span of the semiconductor die 200, while the conductive patterns M1 are disposed over the semiconductor die 200 and the insulating encapsulant 210'. In some embodiments, the conductive patterns M1 extend beyond the span of the semiconductor die 200 and extend over to be above the insulating encapsulant 210'. In one embodiment, the conductive patterns M1 include fan-out routing lines.

Referring to FIG. 1K, a dielectric layer 240 is formed on the dielectric layer 220 and the redistribution conductive layer 230. In some embodiments, the dielectric layer 240 may be formed of a polymeric material including polyimide, PBO or BCB. The dielectric layer 240 may be formed by a suitable fabrication technique such as spin-coating, lamination, deposition, or the like. Then, the dielectric layer 240 is patterned to have a plurality of openings O2 revealing portions of the redistribution conductive layer 230. In some embodiments, the pad structures P1 of the redistribution conductive layer 230 are partially revealed by some of the openings O2 of the dielectric layer 240, and the conductive patterns M1 of the redistribution conductive layer 230 are partially revealed by the other of the openings O2 of the dielectric layer 240. In some embodiments, the dielectric layer 240 may be patterned by photolithography and etching processes.

As shown in FIG. 1K, after the dielectric layer 240 is formed, a redistribution conductive layer 250 is formed on the dielectric layer 240 and covers the openings O2 of the dielectric layer 240. In some embodiments, a material of the redistribution conductive layer 250 may include aluminum, titanium, copper, nickel, tungsten, and/or alloys thereof. The redistribution conductive layer 250 may be formed by forming a metal-containing layer by, for example, electroplating or deposition, and then patterning through photolithography and etching processes. In some embodiments, the redistribution conductive layer 250 is electrically connected to the redistribution conductive layer 230. In some embodiments, the redistribution conductive layer 250 includes a plurality of vias V2$a$, a plurality of vias V2$b$, a plurality of pad structures P2, a plurality of conductive patterns M2, and a plurality of routing line R2. In some embodiments, the vias V2$a$ are disposed on and contact the pad structures P1 in a one-to-one way, and the pad structures P2 are disposed on and contact the vias V2$a$ in a one-to-one way. However, in some alternative embodiments, the vias V2$a$ are disposed on and contact the pad structures P1 in a multiple-to-one way, and the pad structures P2 are disposed on and contact the vias V2$a$ in a one-to-multiple way. In some embodiments, the vias V2$b$ are disposed over and contact the conductive patterns M1, and the conductive patterns M2 are disposed on and contact the vias V2$b$. In some embodiments, the routing lines R2 are disposed over the vias V2$a$ (formed as a via group VG2$a$) and the vias V2$b$ and is located between the pad structures P2. In some embodiments, the pad structures P2, the conductive patterns M2 and the routing line R2 are located at the same level in the redistribution conductive layer 250. That is, in some embodiments, the pad structures P2, the conductive patterns M2 and the routing line R2 are located at the same virtual plane perpendicular to the thickness direction Z. In some embodiments, the via group VG2$a$, the vias V2$b$, the pad structures P2, the conductive patterns M2 and the routing lines R2 are formed at the same time in the same process step. However, in some alternative embodiments, the vias V2$a$ and the vias V2$b$ are formed at the same time in the one process step, but the pad structures P2, the conductive patterns M2 and the routing lines R2 may be formed in another process step(s).

In some embodiments, the vias V2$a$ and the vias V2$b$ are formed to fill up the openings O2 of the dielectric layer 240 such that the vias V2$a$ contact the pad structures P1 partially revealed by the openings O2 of the dielectric layer 240, and the vias V2$b$ contact the conductive patterns M1 partially revealed by the openings O2 of the dielectric layer 240. In some embodiments, each of the conductive patterns M2 may include a narrow extension portion and a wide pad portion, wherein the wide pad portion may function as a pad and connect with the underlying via V2$b$, and the narrow extension portion may function as a routing line or a trace. In some embodiments, each of the routing lines R2 may be a portion of the corresponding one of the conductive patterns M2. However, in some alternative embodiments, the routing lines R2 may function independently for fan-out routing and are not part of the conductive patterns M2. In some embodiments, the pad structures P2 are disposed above the semiconductor die 200 and are located within the span of the semiconductor die 200, while the conductive patterns M2 are disposed over the semiconductor die 200 and the insulating encapsulant 210'. In some embodiments, the conductive patterns M2 extend beyond the span of the semiconductor die 200 and extend over to be above the insulating encapsulant 210'. In one embodiment, the conductive patterns M2 include fan-out routing lines.

Referring to FIG. 1L, a dielectric layer 260 is formed on the dielectric layer 240 and the redistribution conductive layer 250. In some embodiments, the dielectric layer 260 may be formed of a polymeric material including polyimide, PBO or BCB. The dielectric layer 260 may be formed by a suitable fabrication technique such as spin-coating, lamination, deposition, or the like. Then, the dielectric layer 260 is patterned to have a plurality of openings O3 revealing portions of the redistribution conductive layer 250. In some embodiments, the pad structures P2 of the redistribution conductive layer 250 are partially revealed by some of the openings O3 of the dielectric layer 260, and the conductive patterns M2 of the redistribution conductive layer 250 are partially revealed by the other of the openings O3 of the dielectric layer 260. In some embodiments, the dielectric layer 260 may be patterned by photolithography and etching processes.

As shown in FIG. 1L, after the dielectric layer 260 is formed, a redistribution conductive layer 270 is formed on the dielectric layer 260 and covers the openings O3 of the dielectric layer 260. In some embodiments, a material of the redistribution conductive layer 270 may include aluminum, titanium, copper, nickel, tungsten, and/or alloys thereof. The redistribution conductive layer 270 may be formed by forming a metal-containing layer by, for example, electroplating or deposition, and then patterning through photolithography and etching processes. In some embodiments, the redistribution conductive layer 270 is electrically connected to the redistribution conductive layer 250. In some embodiments, the redistribution conductive layer 270 includes a plurality of vias V3$a$, a plurality of vias V3$b$, a pad structure P3, and a plurality of conductive patterns M3. In some embodiments, the vias V3$a$ are disposed on and contact the pad structures P2 in a one-to-one way. However, in some alternative embodiments, the vias V3$a$ are disposed on and contact the pad structures P2 in a multiple-to-one way. In some embodiments, the vias V3$b$ are disposed on and contact the conductive patterns M2. In some embodiments the pad structure P3 is disposed on and contacts the vias V3$a$. In some embodiments, the conductive patterns M3 are disposed on and contact the vias V3$b$. In some embodiments, the pad structure P3 and the conductive patterns M3 are located at the same level in the redistribution conductive layer 270. That is, in some embodiments, the pad structure P3 and the conductive patterns M3 are located at the same virtual plane perpendicular to the thickness direction Z. In some embodiments, the vias V3$a$ (formed as a via group VG3$a$), the vias VG3$b$, the pad structure P3 and the conductive patterns M3 are formed at the same time in the same process step. However, in some alternative embodiments, the vias V3$a$ and the vias V3$b$ are formed at the same time in one process step, but the pad structure P3 and the conductive patterns M3 may be formed in another process step(s).

In some embodiments, the vias V3$a$ and the vias V3$b$ are formed to fill up the openings O3 of the dielectric layer 260 such that the vias V3$a$ contact the pad structures P2 partially revealed by the openings O3 of the dielectric layer 260, and the vias V3$b$ contact the conductive patterns M2 partially revealed by the openings O3 of the dielectric layer 260. In some embodiments, each of the conductive patterns M3 may include a narrow extension portion and a wide pad portion, wherein the wide pad portion may function as a pad and connect with the underlying via V3b, and the narrow extension portion may function as a routing line or a trace. In some embodiments, the pad structure P3 is disposed above the semiconductor die 200 and are located within the span of the semiconductor die 200, while the conductive patterns M3 are disposed over the insulating encapsulant 210'. In some embodiments, the conductive patterns M3 extend beyond the span of the semiconductor die 200 and extend over to be above the insulating encapsulant 210'. In one embodiment, the conductive patterns M3 include fan-out routing lines.

As shown in FIG. 1L, after the redistribution conductive layer 270 is formed, a dielectric layer 280 is formed on the dielectric layer 260 and the redistribution conductive layer 270 to achieve the formation of the redistribution circuit structure RDL. In other words, the redistribution circuit structure RDL may include a plurality of dielectric layers (i.e. the dielectric layers 220, 240, 260, and 280) and a plurality of redistribution conductive layers (i.e. the redistribution conductive layers 230, 250, and 270) stacked alternately. In some embodiments, the dielectric layer 280 may be formed of a polymeric material including polyimide, PBO or BCB. The dielectric layer 280 may be formed by a suitable fabrication technique such as spin-coating, lamination, deposition, or the like. In some embodiments, the dielectric layer 280 may be referred to as a top passivation layer. Then, the dielectric layer 280 is patterned to have a plurality of openings O4 revealing portions of the redistribution conductive layer 270. In some embodiments, the pad structure P3 of the redistribution conductive layer 270 is partially revealed by one of the openings O4 of the dielectric layer 280, and the conductive patterns M3 of the redistribution conductive layer 270 are partially revealed by the other of the openings O4 of the dielectric layer 280. In some embodiments, the dielectric layer 280 may be patterned by photolithography and etching processes.

Referring to FIG. 1M, after the dielectric layer 280 is formed, a plurality of conductive terminals 300 are formed on the redistribution conductive layer 270 and the dielectric layer 280, and a wafer level packaging structure 400 is obtained. In some embodiments, each of the conductive terminals 300 includes a conductive pillar 302 and a conductive bump 304 disposed on the conductive pillar 302. In some embodiments, the conductive terminals 300 are referred to as "controlled collapse chip connection (C4) bumps." In some embodiments, the conductive terminals 300 may be formed by the following steps. First, a seed layer (not shown) is formed over the dielectric layer 280. The seed layer extends into the openings O4 of the dielectric layer 280 to be in contact with the redistribution conductive layer 270. The seed layer may be formed through, for example, a sputtering process, a physical vapor deposition (PVD) process, or the like. In some embodiments, the seed layer may include, for example, copper, titanium-copper alloy, or other suitable choice of materials. Subsequently, a photoresist pattern layer (not shown) having a plurality of openings is formed over the seed layer. The openings of the photoresist pattern layer expose the seed layer located in the openings O4 of the dielectric layer 280 and expose at least a portion of the seed layer located on the dielectric layer 280. Thereafter, a conductive material (not shown) and a solder material (not shown) are sequentially deposited onto the exposed seed layer. That is, the conductive material and the solder material are located within openings of the photoresist pattern layer. In some embodiments, the conductive material and the solder material may be formed by a plating process.

The plating process is, for example, electro-plating, electroless-plating, immersion plating, or the like. In some embodiments, the conductive material includes, for example, copper, copper alloys, or the like. After the conductive material and the solder material are formed, the photoresist pattern layer is removed. Upon removal of the photoresist pattern layer, portions of the seed layer, which are not covered by the conductive material and the solder material, are exposed. In some embodiments, the photoresist pattern layer may be removed/stripped through, for example, etching, ashing, or other suitable removal processes. Then, the seed layer that is not covered by the conductive material and the solder material is removed. The exposed portions of the seed layer may be removed through an etching process. In some embodiments, the remaining seed layer and the conductive material constitute the conductive pillars 302. Thereafter, a reflow process is performed on the solder material to transform the solder material into the conductive bumps 304.

As shown in FIG. 1M, a plurality of vias V1a, a plurality of vias V2a, a plurality of vias V3a, a plurality of pad structures P1, a plurality of pad structures P2, and the pad structure P3 are connected to one conductive terminal 300 to form a connection structure CS1, and one via V1b, one via V2b, one via V3b, one conductive pattern M1, one conductive pattern M2, and one conductive pattern M3 are connected to one conductive terminal 300 to form a connection structure CS2. In some embodiments, as shown in FIG. 1M, the semiconductor die 200 is electrically connected to one connection structure CS1 and two connection structures CS2, but the disclosure is not limited thereto. In some alternative embodiments, the semiconductor die 200 may be electrically connected to more than one connection structure CS1. In some embodiments, the vertical projection of the connection structure CS1 falls within the span of the vertical projection of the semiconductor die 200, while the vertical projection of the connection structure CS2 is partially overlapped with the vertical projection of the semiconductor die 200. That is, the connection structure CS1 is located within the span of the semiconductor die 200, while the connection structure CS2 is disposed on the semiconductor die 200 and the insulating encapsulation 210'. In some embodiments, a vertical projection of each of the vias V1a, a vertical projection of each of the pad structures P1, a vertical projection of each of the vias V2a, a vertical projection of each of the pad structures P2, a vertical projection of each of the vias V3a, a vertical projection of the pad structure P3, and a vertical projection of the conductive terminal 300 are within a vertical projection of the semiconductor die 200.

Figure 2A:
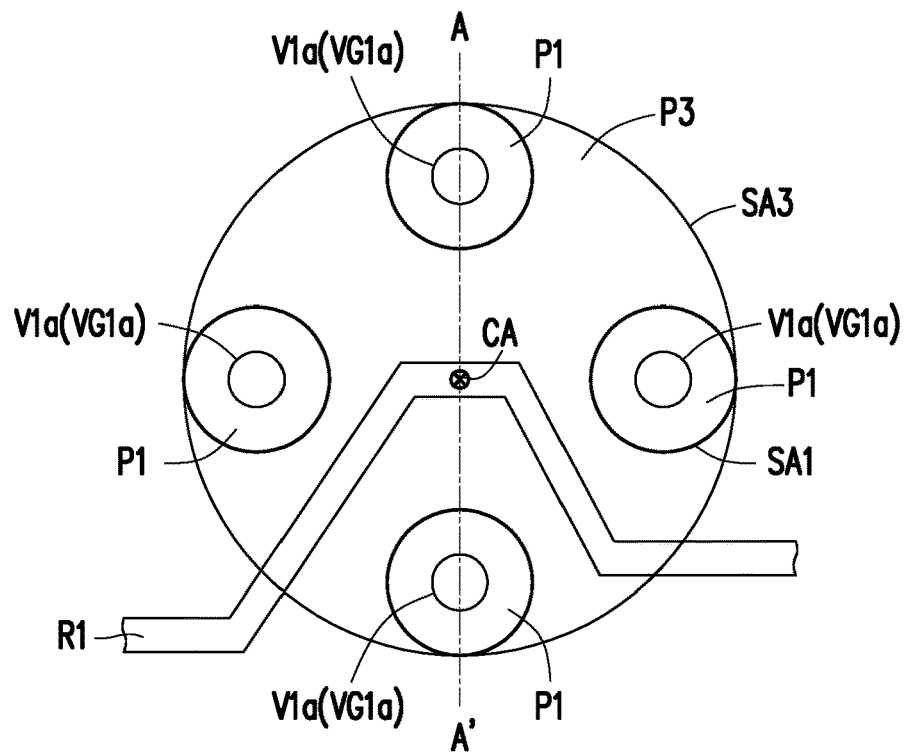
FIG. 2A, FIG. 2B and FIG. 2C are schematic top views illustrating portions of various redistribution conductive layers in the connection structure in accordance with some embodiments.
Figure 2B:
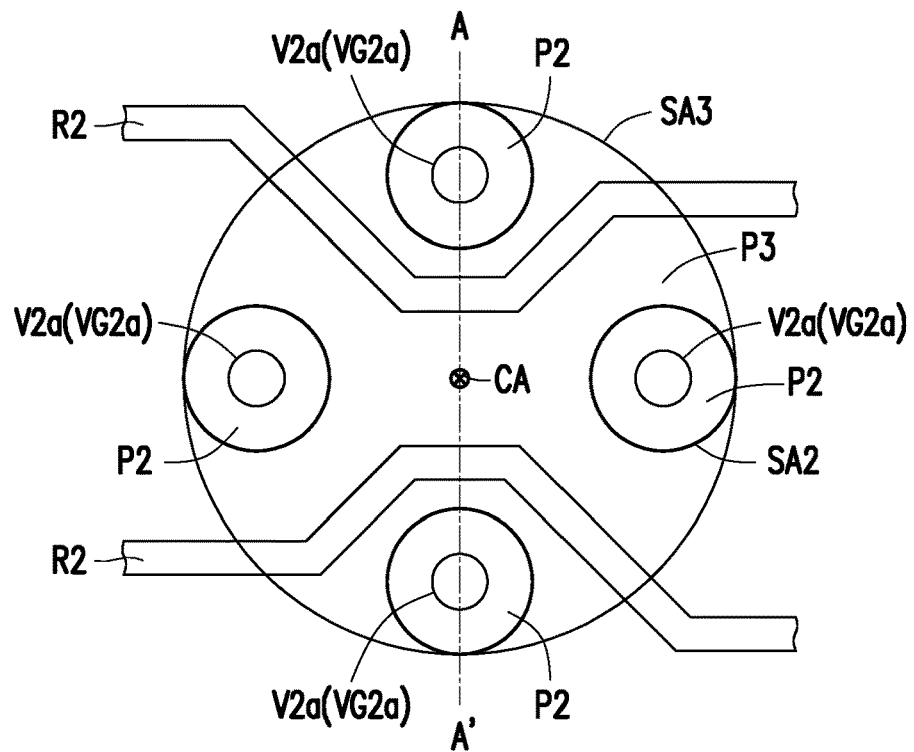
Figure 2C:
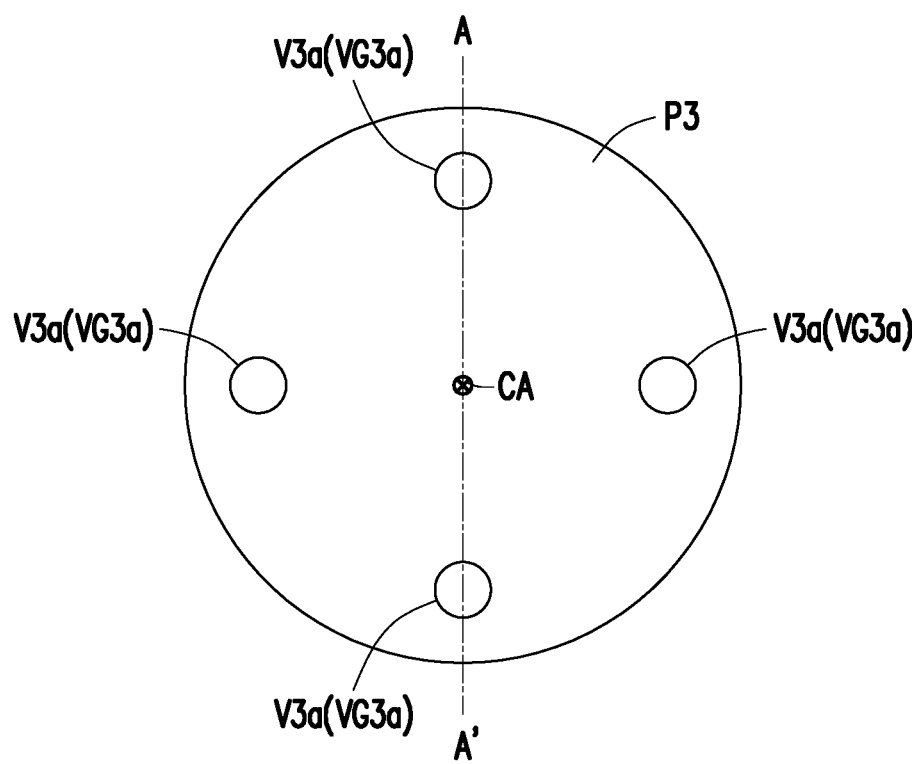

FIG. 2A illustrates a schematic top view of the pad structure P3, the pad structures P1, the vias V1a of the via group VG1a and the routing line R1. FIG. 2B illustrates a schematic top view of the pad structure P3, the pad structures P2, the vias V2a of the via group VG2a, and the routing lines R2. FIG. 2C illustrates a schematic top view of the pad structure P3 and the vias V3a of the via group VG3a. In some embodiments, FIG. 2A, FIG. 2B and FIG. 2C show schematic top views of the connection structure CS1 in FIG. 1O at different redistribution conductive layers, while the schematic cross-sectional view of the connection structure CS1 in the previous embodiment may correspond to portions shown along cross-section line A-A' of FIG. 2A, FIG. 2B and FIG. 2C. For illustration purposes, the dielectric layer(s) filled between the redistribution conductive layers or the connection structure CS1 are omitted or shown as being transparent, but it is understood that there is dielectric layer(s) filled between the routing lines and the connection structure.

As shown in FIG. 2A, the locations of the pad structures P1 (farther away from the conductive terminal 300) correspond to the location of the pad structure P3 (closer to the conductive terminal 300). That is, from the top view and along the thickness direction Z in FIG. 1O, the vertical projection of each of pad structures P1 overlaps the vertical projection of the pad structure P3. In some embodiments, the vertical projection of each of pad structures P1 falls within the span of the vertical projection of the pad structure P3 or falls within the span of the pad structure P3. However, the disclosure is not limited thereto. In some alternative embodiments, the vertical projection of at least one of pad structures P1 may be partially located within the span of the pad structure P3, i.e. the vertical projection of the at least one of pad structures P1 may partially overlap the vertical projection of the pad structure P3, as long as the vertical projection of the corresponding via V1a falls within the span of the pad structure P3. In certain embodiments, in FIG. 2A, if considering the shape of the pad structure P3 being round, the pad structure P3 is a round pad with a span SA3 (may be measured as the area), while the pad structure P1 is a round pad with a span SA1 but the span SA1 is relatively smaller than the span SA3. As shown in FIG. 2A, an overall area of the vertical projections of all the pad structures P1 is smaller than an area of the vertical projection of the pad structure P3. Comparing with the single pad structure P3, four separate and smaller pad structures P1 are arranged with spaces there-between, which spaces may be saved for the arrangement of routing line R1. With such configuration, more flexibility is provided for the design of the layout. As shown in FIG. 2A, a portion of the routing line R1 is formed between the pad structures P1 and the routing line R1 extends across the span of the pad structure P3 and extends around one or more pad structures P1 so that a vertical projection of a portion of the routing line R1 overlaps with the vertical projection of the pad structure P3. That is, by arranging separate pad structures, the routing line R1 is allowed to be arranged between the pad structures P1 and to pass through the space above the pad structure P3, and hence the routing capacity of the connection structure CS1 is improved.

Although the shape of the pad structure P1 or the pad structure P3 is shown to be circular in FIG. 2A, the disclosure is not limited thereto. In some alternative embodiments, the shape of each of the pad structures P1 or the pad structure P3 may be hexagonal, octagonal or any polygonal shape. Although four pad structures P1 are illustrated in FIG. 2A, the disclosure is not limited thereto. In some alternative embodiments, the number of the pad structures P1 may be two, three, five or more. That is, the number of the pad structures P1 illustrated in FIG. 2A merely serves as an exemplary illustration, and the number of the pad structures P1 may vary based on demand. Although one routing line R1 is illustrated in FIG. 2A, the disclosure is not limited thereto. That is, the number of the routing line R1 illustrated in FIG. 2A merely serves as an exemplary illustration, and the number of the routing line R1 may vary based on demand.

As shown in FIG. 2B, the locations of the pad structures P2 (farther away from the conductive terminal 300) correspond to the location of the pad structure P3 (closer to the conductive terminal 300). That is, from the top view and along the thickness direction Z, the vertical projection of each of pad structures P2 overlaps the vertical projection (shown in the solid line) of the pad structure P3. In some embodiments, the vertical projection of each of pad structures P2 falls within the span of the vertical projection of the pad structure P3 or falls within the span of the pad structure P3. However, the disclosure is not limited thereto. In some alternative embodiments, the vertical projection of at least one of pad structures P2 may be partially located within the span of the pad structure P3, i.e. the vertical projection of the at least one of pad structures P2 may partially overlap the vertical projection of the pad structure P3, as long as the vertical projection of the corresponding via V2a falls within the span of the pad structure P3. In certain embodiments, in FIG. 2B, if considering the shape of the pad structure P3 being round, the pad structure P3 is a round pad with the span SA3 (may be measured as the area), while the pad structure P2 is a round pad with a span SA2 but the span SA2 is relatively smaller than the span SA3. As shown in FIG. 2B, an overall area of the vertical projections of all the pad structures P2 is smaller than an area of the vertical projection of the pad structure P3. Comparing with the single bigger pad structure P3, four separate and smaller pad structures P2 are arranged with spaces there-between, which spaces may be saved for the arrangement of routing lines R2. With such configuration, more flexibility is provided for the design of the layout. As shown in FIG. 2B, a portion of each routing line R2 is formed between the pad structures P2 and the routing line R2 extends across the span of the pad structure P3 and extends around one or more pad structures P2 so that a vertical projection of a portion of each routing line R2 overlaps with the vertical projection of the pad structure P3. That is, by arranging separate pad structures, the routing lines R2 are allowed to be arranged between the pad structures P2 and to pass through the space above the pad structure P3, and hence the routing capacity of the connection structure CS1 is improved.

Although the shape of each of the pad structures P2 or the pad structure P3 is shown to be circular in FIG. 2B, the disclosure is not limited thereto. In some alternative embodiments, the shape of each of the pad structures P2 or the pad structure P3 may be hexagonal, octagonal or any polygonal shape. Although four pad structures P2 are illustrated in FIG. 2B, the disclosure is not limited thereto. In some alternative embodiments, the number of the pad structures P2 may be two, three, five or more. That is, the number of the pad structures P2 illustrated in FIG. 2B merely serves as an exemplary illustration, and the number of the pad structures P2 may vary based on demand. Although two routing lines R2 are illustrated in FIG. 2B, the disclosure is not limited thereto. That is, the number of the routing lines R2 illustrated in FIG. 2B merely serves as an exemplary illustration, and the number of the routing lines R2 may vary based on demand.

Referring to FIG. 1M, FIG. 2A, FIG. 2B and FIG. 2C, the vias V1a of the via group VG1a are vertically aligned with the vias V2a of the via group VG2a, and the vias V2a of the via group VG2a are vertically aligned with the vias V3a of the via group VG3a. That is, the vias V1a, V2a and V3a are vertically stacked and aligned with one another. In some embodiments, the pad structures P1 are vertically aligned with the pad structures P2 (i.e. the vertical projections of the pad structures P1 and P2 substantially overlap), and the vertical projections of the pad structures P1 and P2 fall within the span of the pad structure P3. Referring to FIG. 1M, FIG. 2A, FIG. 2B and FIG. 2C, the connection structure CS1 includes multiple vias V1a respectively connected with multiple pad structures P1, multiple vias V2a respectively connected with multiple pad structures P2, and multiple vias V3a connected with the single pad structure P3. In some embodiments, when the connection structure CS1 functions as ground or power terminals, such configuration has better connection reliability owing to the larger size of the pad structure P3 and the joining multiple vias and multiple pad structures. Multiple vias between the stacked pad structures help to distribute large electrical current, thus avoiding possible breakage and improves connection reliability. In some embodiments, the reliability of the connection structure CS1 is 1.1 times to 1.6 times of the reliability of the connection structure CS2.

Referring to FIG. 1N, the wafer-level packaging structure 400 is flipped (turned upside down) and attached or adhered onto a dicing tape DT2. In some embodiments, the dicing tape DT2 may include PVC, polyolefin, polyethylene, or other suitable materials as long as the material is able to hold the above-mentioned structures.

Referring to FIG. 1O, a de-bonding process is performed such that the carrier C is de-bonded and removed from the wafer-level packaging structure 400. In some embodiments, the de-bonding layer DB may be irradiated by an UV laser such that the carrier C and the de-bonding layer DB may be peeled off from the wafer-level packaging structure 400. However, the de-bonding process is not limited thereto. Other suitable de-carrier methods may be used in some alternative embodiments.

Still referring to FIG. 1O, a dicing process is performed along the dicing lines DL to cut the wafer-level packaging structure 400 (cutting through the insulating encapsulant 210', and redistribution circuit structure RDL) into an individual package 40 (as shown in FIG. 1P). In some alternative embodiments, when the wafer-level packaging structure 400 includes more than one of the semiconductor dies 200, after the dicing process is performed, a plurality of individual packages 40 are formed. In some embodiments, the dicing process may include a mechanical blade sawing process, laser cutting process, or other suitable processes.

Referring to FIG. 1P, the package 40 may include the semiconductor die 200 adhered to the adhesive layer 170a and laterally encapsulated by the insulating encapsulant 210', the redistribution circuit structure RDL formed on the semiconductor die 200 and electrically connected to the semiconductor die 200, and the conductive terminals 300, wherein the redistribution circuit structure RDL includes the plurality of dielectric layers 220, 240, 260, and 280 and the plurality of the redistribution conductive layers 230, 250, and 270 stacked alternately. In one embodiment, the package 40 is an integrated fan-out (InFO) package. As shown in 1P, the package 40 is mounted on a substrate 1100 through the conductive bumps 304 of the conductive terminals 300 to obtain the package structure 10. That is, the conductive bumps 304 of the connection structure CS1 and the connection structures CS2 shown in FIG. 1M, FIG. 1N, or FIG. 1O are in the form before the reflow process, and the conductive bumps 304 of the connection structure CS1 and the connection structures CS2 shown in FIG. 1P are in the form after the reflow process for connection between the package 40 and the substrate 1100. In some embodiments, the substrate 1100 may include a printed circuit board (PCB) or the like.

As shown in FIG. 1O, FIG. 2A, FIG. 2B and FIG. 2C, in connection structure CS1, the vias V1a are vertically aligned with the vias V2a, and the vias V2a are vertically aligned with the vias V3a. However, the disclosure is not limited thereto. In some alternative embodiments, the vias V1a may be vertically misaligned with the vias V2a, and the vias V2a may be vertically misaligned with the vias V3a. The details will be described below with reference to FIG. 3, FIG. 4A to FIG. 4C.

Figure 3:
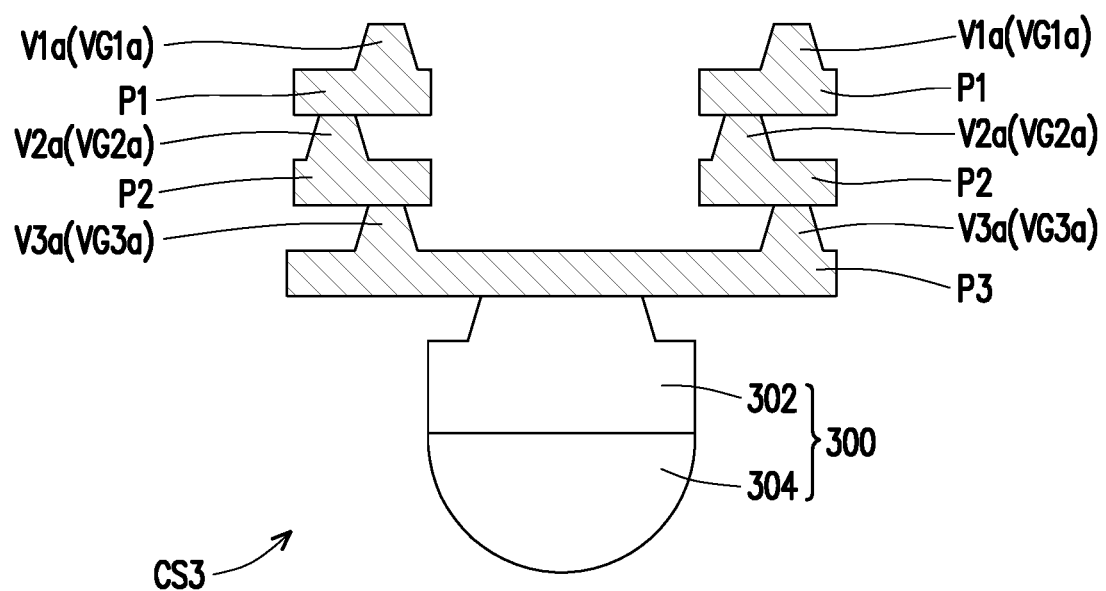
FIG. 3 is a schematic cross-sectional view illustrating a connection structure in accordance with some embodiments.
Figure 4A:
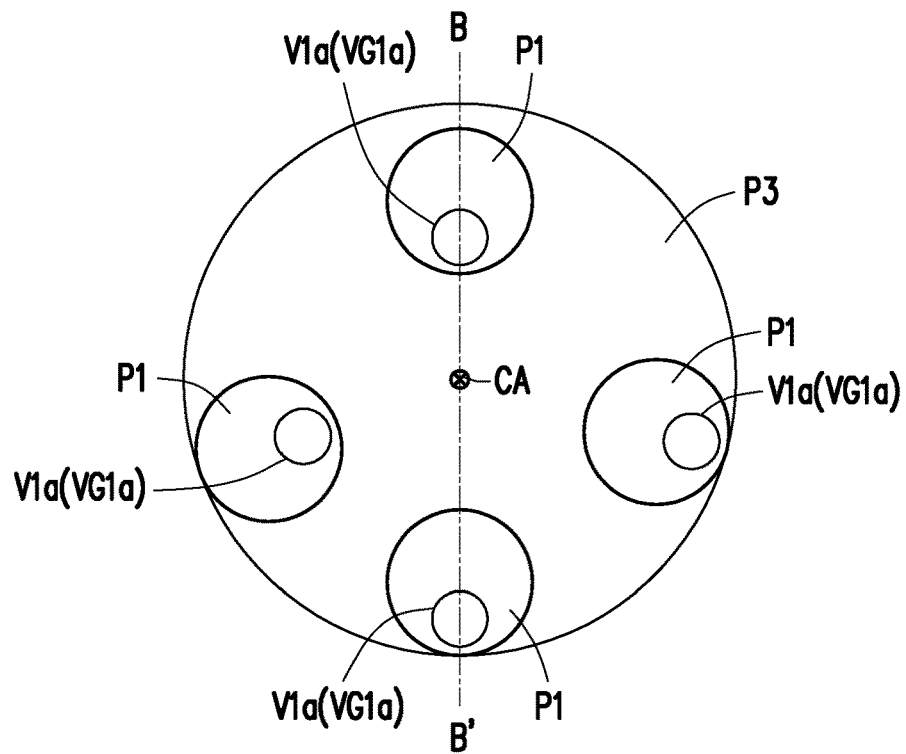
FIG. 4A, FIG. 4B and FIG. 4C are schematic top views illustrating portions of various redistribution conductive layers in the connection structure in accordance with some embodiments.
Figure 4B:
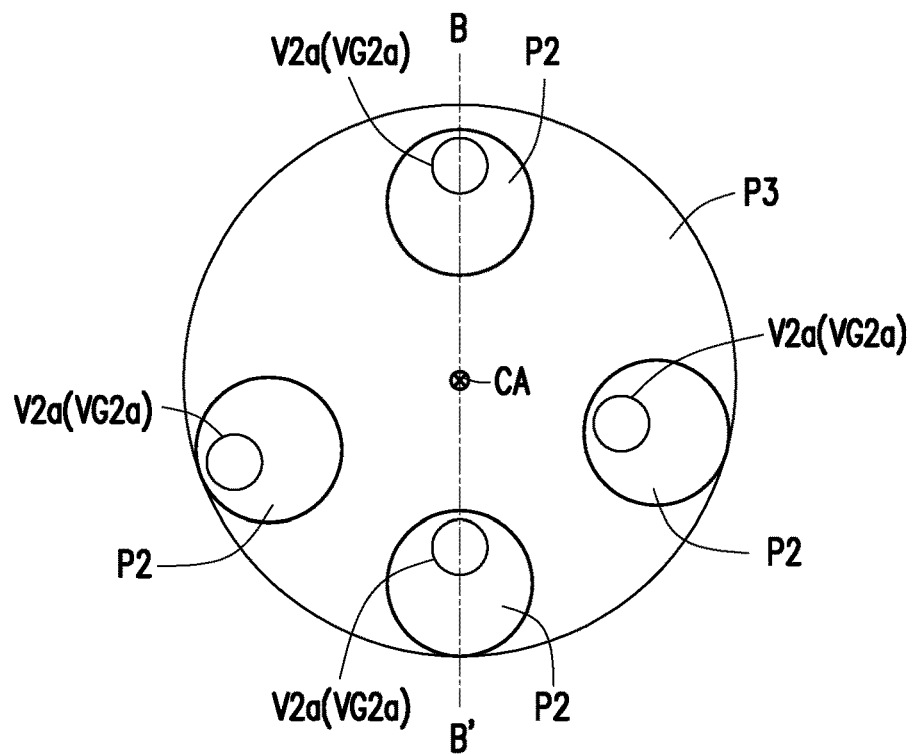
Figure 4C:
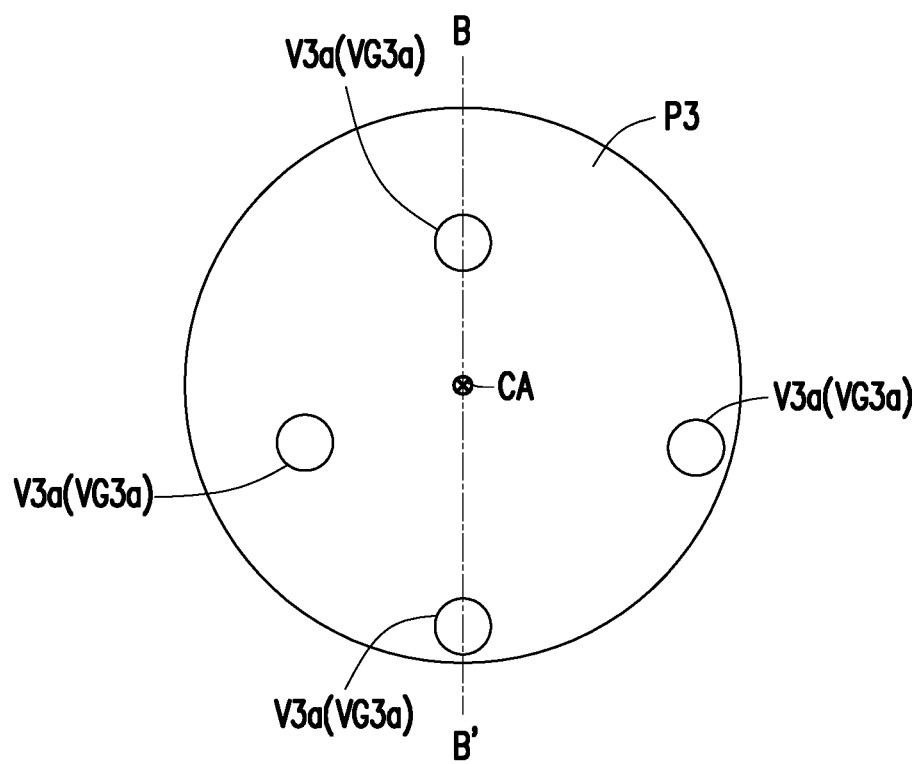

FIG. 3 is a schematic cross-sectional view illustrating a connection structure CS3 in accordance with some embodiments. FIG. 4A illustrates a schematic top view of the pad structure P3 and the vias V1a of the via group VG1a of the connection structure CS3. FIG. 4B illustrates a schematic top view of the pad structure P3, the pad structures P2 and the vias V2a of the via group VG2a of the connection structure CS3. FIG. 4C illustrates a schematic top view of the pad structure P3 and the vias V3a of the via group VG3a of the connection structure CS3. In some embodiments, FIG. 4A, FIG. 4B and FIG. 4C show schematic top views of the connection structure CS3 in FIG. 3 at different redistribution conductive layers, while the schematic cross-sectional view of the connection structure CS3 in FIG. 3 may correspond to portions shown along cross-section line B-B' of FIG. 4A, FIG. 4B and FIG. 4C. For illustration purposes, the dielectric layer(s) filled between the redistribution conductive layers or the connection structure CS3 are omitted or shown as being transparent, but it is understood that there is dielectric layer(s) filled in the connection structure. The elements similar to or substantially the same as the elements described previously will use the same reference numbers, and certain details or descriptions (e.g. the relative configurations or electrical connections, and the formations and materials) of the same elements may not be repeated herein.

As shown in FIG. 3, FIG. 4A and FIG. 4B, in connection structure CS3, the vias V1a are staggered with the vias V2a. As shown in FIG. 3, FIG. 4B and FIG. 4C, in connection structure CS3, the vias V2a are staggered with the vias V3a.

In addition, as shown in FIG. 2A and FIG. 2B, in connection structure CS1, with respect to a virtual axis CA along the thickness direction Z at the central point of the pad structure P3 being round shape, the pad structures P1 located at the virtual plane perpendicular to the thickness direction Z are symmetrically arranged with each other, and the pad structures P2 located at the virtual plane perpendicular to the thickness direction Z are symmetrically arranged with each other, while as shown in FIG. 4A and FIG. 4B, in connection structure CS3, with respect to a virtual axis CA along the thickness direction Z at the central point of the pad structure P3 being round shape, the pad structures P1 located at the virtual plane perpendicular to the thickness direction Z are asymmetrically arranged with each other, and the pad structures P2 located at the virtual plane perpendicular to the thickness direction Z are asymmetrically arranged with each other. As such, it should be noted that the arrangements of the pad structures P1 and the pad structures P2 shown in FIG. 2A to FIG. 2B and FIG. 4A to FIG. 4B merely serve as an exemplary illustration, and the arrangements of the pad structures P1 and the pad structures P2 may be varied based on demand.

As shown in FIG. 1O, FIG. 2A, FIG. 2B and FIG. 2C, in the connection structure CS1, the via group VG1a contacting the pad structures P1 includes more than one via V1a, and the via group VG2a contacting the pad structures P2 includes more than one via V2a. However, the disclosure is not limited thereto. In some alternative embodiments, in the connection structure of the disclosure, the via group VG1a may have one via V1a and contacts one pad structure P1, and the via group VG2a may have one via V2a. The details will be described below with reference to FIG. 5, FIG. 6A to FIG. 6C.

Figure 5:
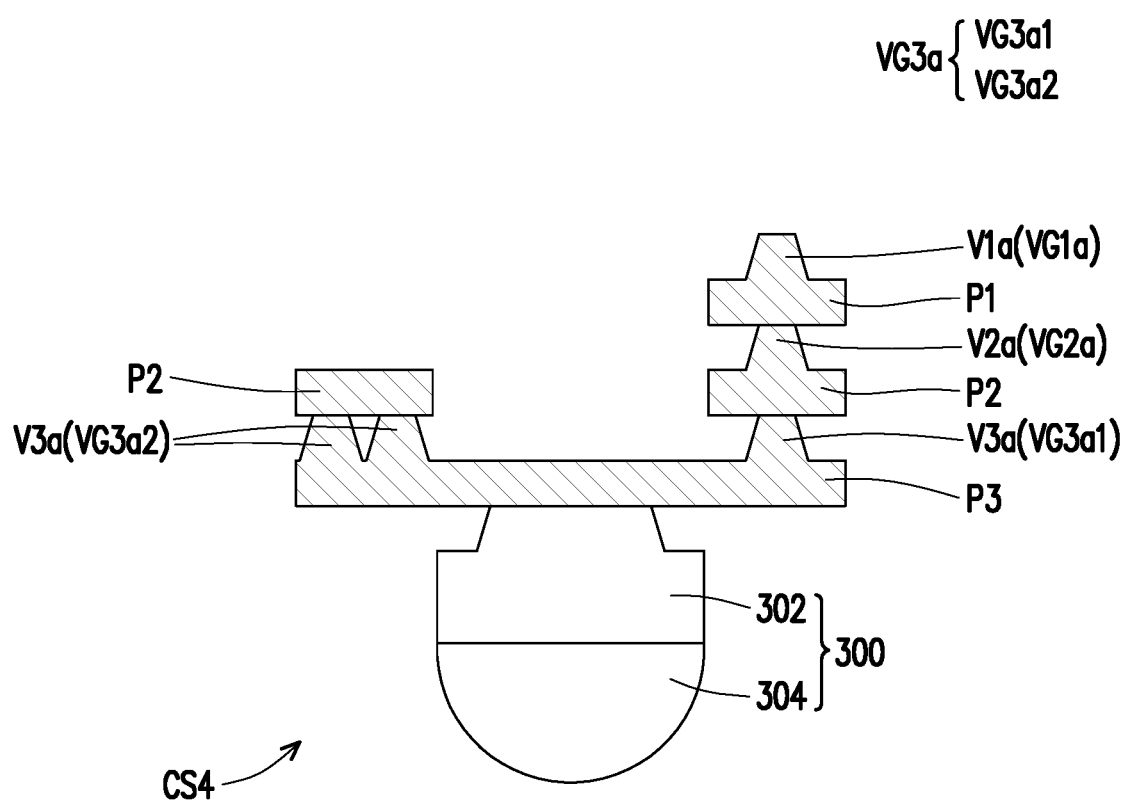
FIG. 5 is a schematic cross-sectional view illustrating a connection structure in accordance with some embodiments.
Figure 6A:
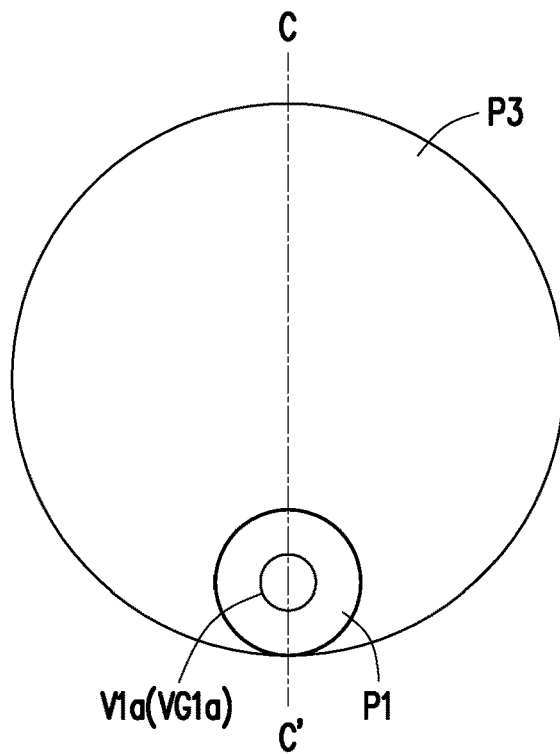
FIG. 6A, FIG. 6B and FIG. 6C are schematic top views illustrating portions of various redistribution conductive layers in the connection structure in accordance with some embodiments.
Figure 6B:
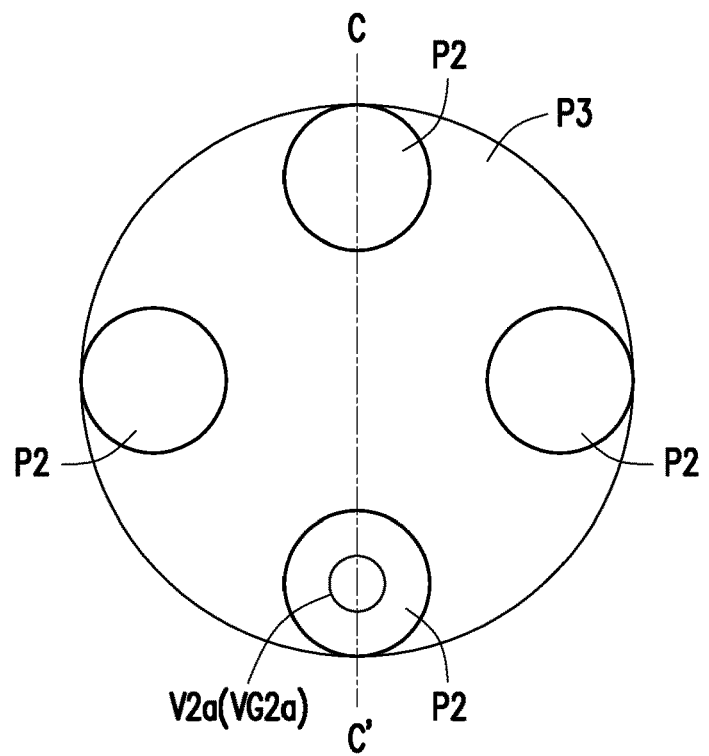
Figure 6C:
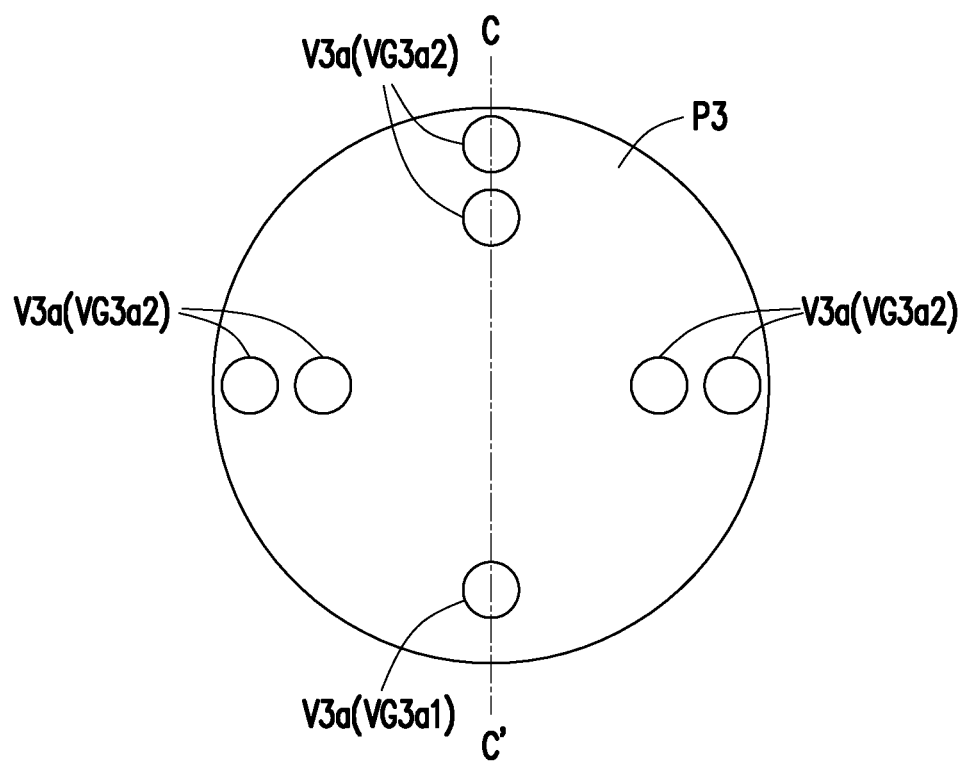

FIG. 5 is a schematic cross-sectional view illustrating a connection structure CS4 in accordance with some embodiments. FIG. 6A illustrates a schematic top view of the pad structure P3, the pad structure P1 and the via V1a of the via group VG1a of the connection structure CS4. FIG. 6B illustrates a schematic top view of the pad structure P3, the pad structures P2 and the via V2a of the via group VG2a of the connection structure CS4. FIG. 6C illustrates a schematic top view of the pad structure P3 and the vias V3a of the via group VG3a of the connection structure CS4. In some embodiments, FIG. 6A, FIG. 6B and FIG. 6C show schematic top views of the connection structure CS4 in FIG. 5 at different redistribution conductive layers, while the schematic cross-sectional view of the connection structure CS4 in FIG. 5 may correspond to portions shown along cross-section line C-C' of FIG. 6A, FIG. 6B and FIG. 6C. For illustration purposes, the dielectric layer(s) filled between the redistribution conductive layers or the connection structure CS4 are omitted or shown as being transparent, but it is understood that there is dielectric layer(s) filled in the connection structure. The elements similar to or substantially the same as the elements described previously will use the same reference numbers, and certain details or descriptions (e.g. the relative configurations or electrical connections, and the formations and materials) of the same elements may not be repeated herein.

As shown in FIG. 5, FIG. 6A and FIG. 6B, in the connection structure CS4, the via V1a of the via group VG1a and the via V2a of the via group VG2a contact the same pad structure P1. That is, the connection structure CS4 has one via V1a, one pad structure P1 and one via V2a. Since the connection structure CS4 has one pad structure P1, a lot of spaces may be saved above the pad structure P3 for the arrangement of routing line(s). As such, more flexibility is provided for the design of the layout and the routing capacity of the connection structure CS4 is improved.

As shown in FIG. 5, FIG. 6B and FIG. 6C, in the connection structure CS4, the via group VG3a is divided into a via group VG3a1 and a via group VG3a2, wherein one of the pad structures P2 contacts and connects with the via V3a of the via group VG3a1 in a one-to-one way, and the rest three of the pad structures P2 contact and connect with the vias V3a of the via group VG3a2 in a one-to-multiple way. Although one pad structure P2 is shown to contact and connect with two vias V3a of the via group VG3a2 in FIG. 5, FIG. 6B and FIG. 6C, the disclosure is not limited thereto. In some alternative embodiments, one pad structure P2 may contact and connect with three, five or more vias V3a of the via group VG3a2. With such configuration, the number of the vias V3a of the connection structure CS4 connecting between the pad structures P2 and the pad structure P3 is more than the number of the via V3b of the connection structure CS2 connecting between the conductive pattern M2 and the conductive pattern M3, therefore the reliability of the connection structure CS4 is improved. In some embodiments, the reliability of the connection structure CS4 is 1.1 times to 1.6 times of the reliability of the connection structure CS2. In some embodiments, in the connection structure CS4, the via V3a of the via group VG3a1 and the via V2a of the via group VG2a contact the same pad structure P2, and the vias V3a of the via group VG3a2 contact the pad structures P2 that do not contact the via group VG2a. In some embodiments, in the connection structure CS4, the via V3a of the via group VG3a1 vertically overlaps with the via V2a of the via group VG2a, while the vias V3a of the via group VG3a2 do not vertically overlap with the via V2a of the via group VG2a.

Figure 7:
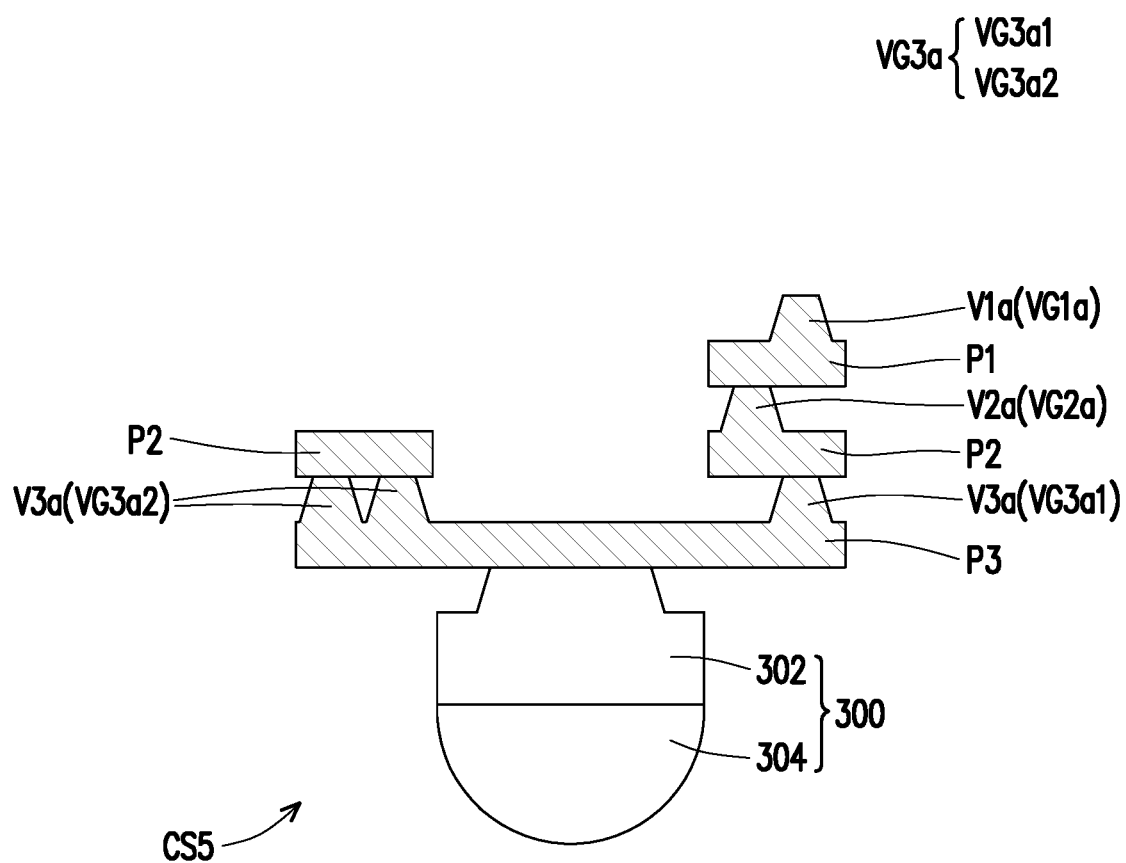
FIG. 7 is a schematic cross-sectional view illustrating a connection structure in accordance with some embodiments.

FIG. 7 is a schematic cross-sectional view illustrating a connection structure CS5 in accordance with some embodiments. Referring to FIG. 7 and FIG. 5, the connection structure CS5 illustrated in FIG. 7 is similar to the connection structure CS4 illustrated in FIG. 5, except the difference therebetween lies mainly in the configuration of the via group VG1a, the via group VG2a and the via group VG3a1. For illustration purposes, the dielectric layer(s) filled between the redistribution conductive layers or the connection structure CS5 are omitted or shown as being transparent, but it is understood that there is dielectric layer(s) filled in the connection structure. The elements similar to or substantially the same as the elements described previously will use the same reference numbers, and certain details or descriptions (e.g. the relative configurations or electrical connections, and the formations and materials) of the same elements may not be repeated herein.

Referring to FIG. 7 and FIG. 5, in the connection structure CS5 of FIG. 7, the via V1a of the via group VG1a is staggered with the via V2a of the via group VG2a, and the via V2a of the via group VG2a is staggered with the via V3a of the via group VG3a1; while in the connection structure CS4 of FIG. 5, the via V1a of the via group VG1a is vertically aligned with the via V2a of the via group VG2a, and the via V2a of the via group VG2a is vertically aligned with the via V3a of the via group VG3a1. That is, in the connection structure CS5 of FIG. 7, the via V1a of the via group VG1a is vertically misaligned with the via V2a of via group VG2a, and the via V2a of via group VG2a is vertically misaligned with the via V3a of the via group VG3a1.

Figure 8:
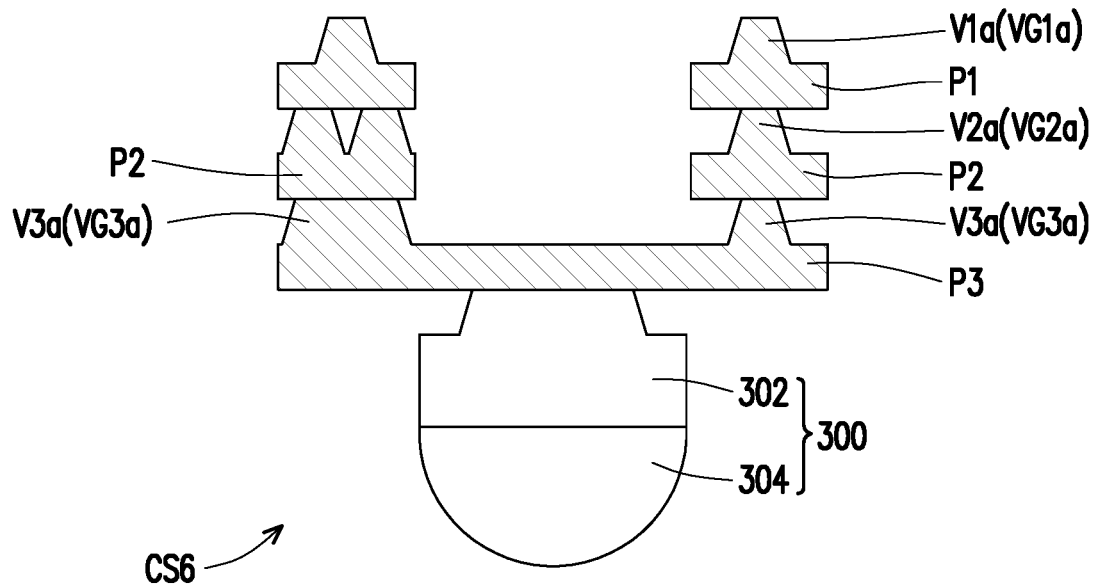
FIG. 8 is a schematic cross-sectional view illustrating a connection structure in accordance with some embodiments.

FIG. 8 is a schematic cross-sectional view illustrating a connection structure CS6 in accordance with some embodiments. Referring to FIG. 8 and FIG. 1O, the connection structure CS5 illustrated in FIG. 7 is similar to the connection structure CS1 illustrated in FIG. 1O, except the difference therebetween lies mainly in the configuration of the via group VG2a and the via group VG3a. For illustration purposes, the dielectric layer(s) filled between the redistribution conductive layers or the connection structure CS6 are omitted or shown as being transparent, but it is understood that there is dielectric layer(s) filled in the connection structure. The elements similar to or substantially the same as the elements described previously will use the same reference numbers, and certain details or descriptions (e.g. the relative configurations or electrical connections, and the formations and materials) of the same elements may not be repeated herein.

Referring to FIG. 8, in the connection structure CS6, one of the pad structures P2 contacts and connects with the vias V2a of the via group VG2a in a one-to-multiple way, while another one of the pad structures P2 contacts and connects with the via V2a of the via group VG2a in a one-to-one way. Although one pad structure P2 is shown to contact and connect with two vias V2a of the via group VG2a in FIG. 7, the disclosure is not limited thereto. In some alternative embodiments, one pad structure P2 may contact and connect with three, five or more vias V2a of the via group VG2a. With such configuration, the reliability of the connection structure CS6 is improved, due to the increasing number of the vias V2a connecting between the pad structures P2 and the pad structure P3. Although one pad structure P2 is shown to contact and connect with the vias V2a of the via group VG2a in a one-to-multiple way in FIG. 7, the disclosure is not limited thereto. In some alternative embodiments, one pad structure P2 may contact and connect with the vias V3a of the via group VG3a in a one-to-multiple way and/or one pad structure P1 may contact and connect with the vias V1a of the via group VG1a in a one-to-multiple way.

In addition, referring to FIG. 8, in the connection structure CS6, the size of one of the vias V3a is greater than the size of another one of the vias V3a. That is, in the connection structure CS6, the contacting area between one of the vias V3a and the corresponding pad structure P2 is greater than the contacting area between another one of the vias V3a and the corresponding pad structure P2. With such configuration, the reliability of the connection structure CS6 is improved, due to the increasing contacting area between the vias V3a and the pad structures P2. In some embodiments, in the connection structure CS6, the contacting area between one of the vias V3a and the corresponding pad structure P2 is 1 times to 4 times of the contacting area between another one of the vias V3a and the corresponding pad structure P2. In some embodiments, the reliability of the connection structure CS6 is 1.1 times to 1.6 times of the reliability of the connection structure CS2. Although the vias V3a of the via group VG3a is shown to have different sizes in FIG. 8, the disclosure is not limited thereto. In some alternative embodiments, the vias V1a of the via group VG1a may have different sizes and/or the vias V2a of the via group VG2a may have different sizes.

Figure 9:
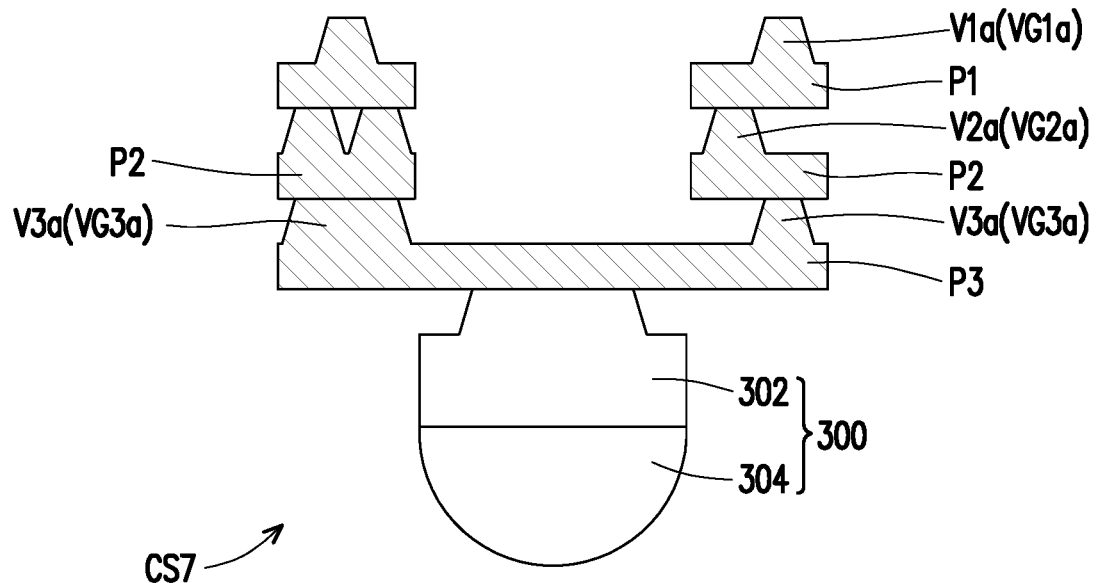
FIG. 9 is a schematic cross-sectional view illustrating a connection structure in accordance with some embodiments.

FIG. 9 is a schematic cross-sectional view illustrating a connection structure CS7 in accordance with some embodiments. Referring to FIG. 9 and FIG. 8, the connection structure CS7 illustrated in FIG. 9 is similar to the connection structure CS6 illustrated in FIG. 8, except the difference therebetween lies mainly in the configuration of the via group VG1a, the via group VG2a and the via group VG3a. For illustration purposes, the dielectric layer(s) filled between the redistribution conductive layers or the connection structure CS7 are omitted or shown as being transparent, but it is understood that there is dielectric layer(s) filled in the connection structure. The elements similar to or substantially the same as the elements described previously will use the same reference numbers, and certain details or descriptions (e.g. the relative configurations or electrical connections, and the formations and materials) of the same elements may not be repeated herein.

Referring to FIG. 9 and FIG. 8, in the connection structure CS7 of FIG. 9, the via V1a is staggered with the via V2a contacting the same pad structure P1 as the said via V1a, and the via V2a is staggered with the via V3a which contacting the same pad structure P2 as the said via V2a; while in the connection structure CS6 of FIG. 8, the via V1a is vertically aligned with the via V2a which contacting the same pad structure P1 as the said via V1a, and the via V2a is vertically aligned with the via V3a which contacting the same pad structure P2 as the said via V2a. That is, in the connection structure CS7 of FIG. 9, the via V1a is vertically misaligned with the via V2a which contacting the same pad structure P1 as the said via V1a, and the via V2a is vertically misaligned with the via V3a which contacting the same pad structure P2 as the said via V2a.

In accordance with some embodiments of the disclosure, a semiconductor package includes a semiconductor die and a connection structure. The semiconductor die is laterally encapsulated by an insulating encapsulant. The connection structure is disposed on the semiconductor die, the connection structure is electrically connected to the semiconductor die, and the connection structure includes at least one first via, first pad structures, second vias, a second pad structure and a conductive terminal. The at least one first via is disposed over and electrically connected to the semiconductor die. The first pad structures are disposed over the at least one first via, wherein the at least one first via contacts at least one of the first pad structures. The second vias are disposed over the first pad structures, wherein the second vias contact the first pad structures. The second pad structure is disposed over and contacts the second vias, wherein a vertical projection of each of first pad structures overlaps with a vertical projection of the second pad structure, and an overall area of the vertical projections of the first pad structures is smaller than an area of the vertical projection of the second pad structure. The conductive terminal is disposed over and connects with the second pad structure.

In accordance with some embodiments of the disclosure, a semiconductor package includes a semiconductor die, an encapsulant, a conductive terminal, and a redistribution circuit structure. The encapsulant encapsulates the semiconductor die therein. The conductive terminal is disposed over the semiconductor die. The redistribution circuit structure is disposed between the semiconductor die and the conductive terminal and has conductive layers therein, wherein the redistribution circuit structure includes first vias, first pad structures, second vias, a second pad structure, and at least one first routing line. The first vias are disposed on the semiconductor die and electrically connected to the semiconductor die. The first pad structures are disposed on and contact the first vias. The second vias are disposed on and contact the first pad structures. The second pad structure is disposed on and contacts the second vias, wherein a vertical projection of each of the first vias and a vertical projection of each of the second vias are located within a span of a vertical projection of the second pad structure. The at least one routing line is disposed under the second pad structure, wherein the at least one routing line is located between the first pad structures, and the at least one routing line and the first pad structures are located in a same conductive layer.

In accordance with some embodiments of the disclosure, a method of manufacturing a semiconductor package includes at least the following steps. A semiconductor die having conductive pillars is provided over a carrier. The semiconductor die is laterally encapsulated with an insulating encapsulant. First vias are formed on the conductive pillars, wherein the first vias are electrically connected to the conductive pillars. First pad structures are formed on the first vias, wherein the first pad structures respectively contact the first vias. Second vias are formed on the first pad structures, wherein the second vias contact the first pad structures. Second pad structures are formed on the second vias and at least one routing line is formed between the second pad structures, wherein the second pad structures are vertically aligned with the first pad structures. Third vias are formed on the second pad structures, wherein the third vias contact the second pad structures. A third pad structure is formed on the third vias and covers the second pad structures, the first pad structures and a portion of the at least one routing line, wherein the third pad structure contacts the third vias, and a span of the third pad structure overlaps a span of each of first pad structures and a span of each of second pad structures. A conductive terminal is formed on the third pad structure, wherein the conductive terminal connects with the third pad structure and is electrically connected with the semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a semiconductor die; and
a connection structure disposed on the semiconductor die, the connection structure being electrically connected to the semiconductor die, and the connection structure comprising:
first pad structures;
a second pad structure electrically connected to the first pad structures, wherein a vertical projection of each of the first pad structures overlaps with a vertical projection of the second pad structure, and an overall area of the vertical projections of the first pad structures is smaller than an area of the vertical projection of the second pad structure; and
a conductive terminal electrically connected to the second pad structure, wherein the first pad structures are disposed between the second pad structure and the semiconductor die, the second pad structure is disposed between the conductive terminal and the first pad structures.

2. The semiconductor package according to claim 1, wherein the connection structure further comprises:
at least one first via disposed between the first pad structures and the semiconductor die, and electrically connected to the first pad structures; and
second vias disposed between and electrically connected to the first pad structures and the second pad structure.

3. The semiconductor package according to claim 2, wherein the at least one first via and one of the second vias are connected to two opposite sides of the at least one of the first pad structures, wherein the one of the second vias is vertically aligned with the at least one first via.

4. The semiconductor package according to claim 2, wherein the at least one first via and one of the second vias are connected to two opposite sides of the at least one of the first pad structures, wherein the one of the second vias and the at least one first via are vertically staggered.

5. The semiconductor package according to claim 2, wherein the first pad structures contact the second vias in a one-to-one way.

6. The semiconductor package according to claim 2, wherein the first pad structures contact the second vias in a one-to-multiple way.

7. The semiconductor package according to claim 2, wherein a size of one of the second vias is greater than a size of another one of the second vias.

8. The semiconductor package according to claim 2, wherein the at least one first via comprises first vias, the connection structure further comprises third pad structures disposed between the first vias and the semiconductor die, wherein a vertical projection of each of the third pad structures overlaps with the vertical projection of the second pad structure, and an overall area of the vertical projections of the third pad structures is smaller than the area of the vertical projection of the second pad structure.

9. The semiconductor package according to claim 1, further comprising at least one routing line located at the same level with the first pad structures, wherein a vertical projection of the at least one routing line at least partially overlaps with the vertical projection of the second pad structure.

10. A semiconductor package, comprising:
a semiconductor die;
a conductive terminal disposed over the semiconductor die; and
a redistribution circuit structure disposed between the semiconductor die and the conductive terminal and having conductive layers therein, wherein the redistribution circuit structure comprises:
first vias electrically connected with the semiconductor die and the conductive terminal;
first pad structures disposed closer to the conductive terminal than the first vias in a thickness direction and electrically connected to the first vias;
second vias disposed closer to the conductive terminal than the first pad structures in the thickness direction and electrically connected to the first pad structures;
a second pad structure disposed closer to the conductive terminal than the second vias in the thickness direction and electrically connected to the second vias, wherein a vertical projection of each of the first vias and a vertical projection of each of the second vias are located within a span of a vertical projection of the second pad structure; and
at least one routing line located between the first pad structures, and located in the same conductive layer as the first pad structures.

11. The semiconductor package according to claim 10, wherein the first pad structures contact the second vias in a one-to-one way.

12. The semiconductor package according to claim 10, wherein the first pad structures contact the second vias in a one-to-multiple way.

13. The semiconductor package according to claim 10, wherein one of the first vias is vertically aligned with one of the second vias.

14. The semiconductor package according to claim 10, wherein one of the first vias is vertically misaligned with one of the second vias.

15. The semiconductor package according to claim 10, wherein a size of one of the second vias is greater than a size of another one of the second vias.

16. The semiconductor package according to claim 10, wherein the redistribution circuit structure further comprises:
third pad structures disposed closer to the semiconductor die than the first pad structures; and
third vias disposed closer to the semiconductor die than the third pad structures, wherein a vertical projection of each of the third vias is located within the span of the vertical projection of the second pad structure.

17. The semiconductor package according to claim 16, wherein the third pad structures are vertically aligned with the first pad structures.

18. A method of manufacturing a semiconductor package, comprising:
providing a semiconductor die;
forming first pad structures over the semiconductor die, wherein the first pad structures electrically connected to the semiconductor die;
forming second pad structures over the first pad structures and forming at least one routing line between the second pad structures, wherein the second pad structures are electrically connected to the first pad structures; and
forming a third pad structure over the second pad structures and a portion of the at least one routing line, wherein a span of the third pad structure overlaps a span of each of first pad structures and a span of each of second pad structures, and the third pad structure is electrically connected to the second pad structures.

19. The method according to claim 18, further comprising forming a conductive terminal on the third pad structure, wherein the conductive terminal connects with the third pad structure.

20. The method according to claim 18, wherein forming second pad structures over the first pad structures comprises forming the second pad structures vertically aligned with the first pad structures.

* * * * *